(12) United States Patent
Dai et al.

(10) Patent No.: US 9,237,658 B2
(45) Date of Patent: Jan. 12, 2016

(54) STRONGLY COUPLED INORGANIC-GRAPHENE HYBRID MATERIALS, APPARATUSES, SYSTEMS AND METHODS

(71) Applicant: The Board of Trustees of the Leland Stanford Junior University, Palo Alto, CA (US)

(72) Inventors: Hongjie Dai, Cupertino, CA (US); Hailiang Wang, Stanford, CA (US); Ming Gong, Stanford, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 400 days.

(21) Appl. No.: 13/768,810

(22) Filed: Feb. 15, 2013

(65) Prior Publication Data
US 2013/0189580 A1    Jul. 25, 2013

Related U.S. Application Data

(63) Continuation-in-part of application No. 13/401,655, filed on Feb. 21, 2012.

(60) Provisional application No. 61/444,480, filed on Feb. 18, 2011, provisional application No. 61/444,468, filed on Feb. 18, 2011, provisional application No. 61/600,400, filed on Feb. 17, 2012, provisional application No. 61/761,401, filed on Feb. 6, 2013.

(51) Int. Cl.
*H01M 4/02* (2006.01)
*H05K 3/30* (2006.01)
*H01B 1/08* (2006.01)
(Continued)

(52) U.S. Cl.
CPC . *H05K 3/30* (2013.01); *B82Y 30/00* (2013.01); *B82Y 40/00* (2013.01); *H01B 1/08* (2013.01); *H01G 11/36* (2013.01); *H01M 4/0471* (2013.01); *H01M 4/131* (2013.01); *H01M 4/133* (2013.01); *H01M 4/366* (2013.01); *H01M 4/583* (2013.01); *H01M 4/625* (2013.01); *H01M 4/13* (2013.01); *Y02E 60/13* (2013.01); *Y10S 977/734* (2013.01); *Y10S 977/748* (2013.01);
(Continued)

(58) Field of Classification Search
CPC .... H01M 4/0471; H01M 4/131; H01M 4/366
USPC .......................................................... 429/224
See application file for complete search history.

(56) References Cited

PUBLICATIONS

Vinod Gupta and Tawfik A. Saleh (2011). Syntheses of Carbon Nanotube-Metal Oxides Composites; Adsorption and Photo-degradation, Carbon Nanotubes—From Research to Applications, Dr. Stefano Bianco (Ed.), ISBN: 978-953-307-500-6, InTech, Available from: http://www.intechopen.com/books/carbon-nanotubesfrom-research-to-applications/syntheses-of-carbo.*

(Continued)

*Primary Examiner* — Basia Ridley
*Assistant Examiner* — James Erwin
(74) *Attorney, Agent, or Firm* — Crawford Maunu PLLC

(57) ABSTRACT

Nanocarbon-based materials are provided in connection with various devices and methods of manufacturing. As consistent with one or more embodiments, an apparatus includes a nanocarbon structure having inorganic particles covalently bonded thereto. The resulting hybrid structure functions as a circuit node such as an electrode terminal. In various embodiments, the hybrid structure includes two or more electrodes, at least one of which including the nanocarbon structure with inorganic particles covalently bonded thereto.

24 Claims, 26 Drawing Sheets

(51) Int. Cl.

| | | |
|---|---|---|
| H01G 11/36 | (2013.01) | |
| H01M 4/133 | (2010.01) | |
| H01M 4/583 | (2010.01) | |
| B82Y 40/00 | (2011.01) | |
| H01M 4/36 | (2006.01) | |
| H01M 4/131 | (2010.01) | |
| H01M 4/04 | (2006.01) | |
| B82Y 30/00 | (2011.01) | |
| H01M 4/62 | (2006.01) | |
| H01M 4/13 | (2010.01) | |

(52) U.S. Cl.
CPC ........... Y10S977/847 (2013.01); Y10S 977/932 (2013.01); Y10T 29/4913 (2015.01)

(56) References Cited

PUBLICATIONS

Wang, H.; Liang, Y.; Mirfakhrai, T.; Chen, Z.; Sanches Casalongue, H. and Dai, H., "Advanced Asymmetrical Supercapacitors Based on Graphene Hybrid Materials." *Nano Research* 4(8), pp. 729-736 (Aug. 2011).
Liu, N.; Hu, L.; McDowell, M. T.; Jackson, A. and Cui, Y., "Prelithiated Silicon Nanowires as an Anode for Lithium Ion Batteries." *ACS, Nano* 5(8), pp. 6487-6493 (Jun. 2011).
Padhi, A. K.; Nanjundaswamy, K. S. and Goodenough, J. B., "Phospho-olivines as Positive-Eletrode Materials for Rechargeable Lithium Batteries." *J. Electrochem. Soc.* 144, pp. 1188-1194, (1997).
Kotz, R. and Carlen, M., "Principles and Applications of Electrochemical Capacitors." *Electrochimica Acta*, 45, pp. 2483-2498, (1999).
Whittingham, M. S., "Lithium Batteries and Cathode Materials." *Chem. Rev.* 104, pp. 4271-4301, (2004).
Winter, M. and Brodd, R. J., "What are Batteries, Fuel Cells and Supercapacitors?" *Chem ReV.* 104, pp. 4245-4269, (2004).
Novoselov, K.S.; Geim, A. K.; Morozov, S. V.; Jiang, D.; Zhang, Y.; Dubonos, V.; Grigorieva, I. V. and Firsov, A. A., "Electric Field Effect in Atomically Thin Carbon Films."*Science* 306, pp. 666-669, (2004).
Wang, Y.; Wang, Z. and Xia, Y., "An asymmetric supercapacitor using RuO2/TiO2 nanotube composite and activated carbon electrodes." *Electrochim. Acta*, 50, pp. 5641-5646, (2005).
Yin, Y. and Alivisatos, A. P., "Nanoscale Materials," *Nature* 437, pp. 664-670, (2005).
Li, X.; Wang, X.; Zhang, L.; Lee, S. and Dai, H., "Chemically Derived, Ultrasmooth Graphene Nanoribbon Semiconuctors." *Science*, 319, pp. 1229-1232, (2008).
Simon, P. and Gogotsi, Y., "Materials for Electrochemical Capacitors." *Nat. Mater.*, 7, pp. 845-854, (2008).
Bruce, P. G.; Scrosati, B. and Tarascon, J., "Nanomaterials for Rechargeable Lithium Batteries." *Angew. Chem. Int. Ed.* 47, pp. 2930-2946, (2008).
Wang, Y.; Wang, Y.; Hosono, E.; Wang, K. and Zhou, H., "The Design of a LiFePO4/Carbon Nanocomposite with a Core-Shell Structure and Its Synthesis by an In Situ Polymerization Restriction Method." *Angew. Chem. Int. Ed.* 47, pp. 7461-7465, (2008).
Wang, L.; Zhou, F. and Ceder, G., "Ab Initio Study of the Surface Properties and Nanoscale Effects of LiMnPO4." *Electrochem. Solid State Lett.* 11, A94-A96, (2008).
Zaghib, K.; Mauger, A.; Fendron, F.; Massot, M. and Julien, C. M., "Insertion Properties of LiFe0.5Mn0.5PO4 Electrode Materials for Li-ion Batteries." *Ionics* 14, pp. 371-376, (2008).
Sun, X.; Liu, Z.; Welsher, K.; Robinson, J. T.; Goodwin, A.; Zaric, S. and Dai, H., "Nano-Graphene Oxide for Cellular Imaging and Drug Deliver." *Nano Res.*, 1(3), pp. 203-212, (2008).
Guo, Y.; Hu, J. and Wan, L., "Nanostructured Materials for Electrochemical Energy Conversion and Storage Devices." *Adv. Mater.*, 20, pp. 2878-2887, (2008).
Li, Y.; Tan, B. and Wu, Y., "Exploring Nanowire Arrays and Graphene Hybrid Materials for Lithium Battery." *Nano Lett.*, 8, pp. 265-270, (2008).

Stoller, M. D.; Park, S.; Zhu, Y.; An, J. and Ruoff, R. S., "Graphene-Based Ultracapacitors." *Nano Letters*, vol. 8, No. 10, pp. 3498-3502, (2008).
Armand, M. and Tarascon, J., "Building Better Batteries." *Nature*, vol. 451, pp. 652-657, (2008).
Wang, H.; Wang, X.; Li, X. and Dai, H., "Chemical Self-Assembly of Graphene Sheets." *Nano Res.* vol. 2, pp. 336-342, (2009).
Mkhoyan, K. A.; Contryman, A. W.; Silcox, J.; Stewart, D. A.; Eda, G.; Mattevi, C.; Miller, S. and Chhowalla, M., "Atomic and Electronic Structure of Graphene-Oxide." *Nano Lett* 9, pp. 1058-1063, (2009).
Wang, Y.; Shi, Z.; Huang, T.; Ma, Y.; Wang, C.; Chen, M.; and Chen, Y., "Supercapacitor Devices Based on Graphene Materials." *J. Phys. Chem. C*, 113, pp. 13103-13107, (2009).
Meduri, P.; Pendyala, C.; Kumar, V.; Sumanasekera, G. U. and Sunkara, M. K., "Hybrid Tin Oxide Nanowires as Stable and High Capacity Anodes for Li-Ion Batteries." *Nano Lett.*, 9, pp. 612-616, (2009).
Ko, J. M. and Kim, K. M., "Electrochemical Properties of MnO2/Activated Carbon Nanotube Composite as an Electrode Material for Supercapacitor." *Materials Chemisty and Physics*, 114, pp. 837-841, (2009).
Wang, H.; Wang, X.; Li, X. and Dai, H., "Chemical Slef-Assembly of Graphene Sheets." *Nano Res*, 2, pp. 336-342, (2009).
Murugan, A. V.; Muraliganth, T.; Ferreira, P. J and Manthiram, A., "Dimensionally Modulated, Single-Crystalline LiMPO4 (M=Mn, Fe, Co, and Ni) with Nano-Thumblike Shapes for High-Power Energy Storage." *Inorg. Chem.* 48, pp. 946-952, (2009).
Kang, B. and Ceder, G., "Battery Materials for Ultrafast Charging and Discharging." *Nature*, 458, pp. 190-193, (2009).
Martha, S. K.; Markovsky, B.; Grinblat, J.; Gofer, Y.; Haik, O.; Zinigrad, E.; Aurbach, D.; Drezen, T.; Wang, D.; Deghenghi, G. and Exnar, I., "LiMnPO4 as an Advanced Cathode Material for Rechargeable Lithium Batteries." *J. Electrochem. Soc.* 156, A541-A552, (2009).
Park, S. and Ruoff, R. S., "Chemical Methods for the Production of Graphenes." *Nature Nanotechnol.* 4, pp. 217-224, (2009).
Yang, X.; Zhang, X.; Ma, Y.; Huang, Y.; Wang, Y. and Chen, Y., "Superparamagnetic Graphene Oxide—Fe3O4 Nanoparticles Hybrid for Controlled Targeted Drug Carriers." *J. Mater. Chem*, 19, pp. 2710-2714, (2009).
Kong, L.; Lang, J.; Liu, M.; Luo, Y. and Kang, L., "Facile Approach to Prepare Loose-Packed Cobalt Hydroxide Nano-Flakes Materials for Electrochemical Camacitors." *J. Power Sources*, 194, pp. 1194-1201, (2009).
Lang, J.; Kong, L.; Wu, W.; Liu, M. and Luo, Y., "A Facile Approach to the Preparation of Loose-Packed Ni(OH)2 Nanoflake Materials for Electrochemical Capacitors." *J. Solid State Electrochem.*, 13, pp. 333-340, (2009).
Wang, D.; Choi, D.; Li, J.; Yang, Z.; Nie, Z.; Kou, R.; Hu, D.; Wang, C.; Saraf, L. V.; Zhang, J.; Aksay, I. A. and Liu, J., "Self-Assembled TiO2-Graphene Hybrid Nanostructures for Enhanced Li-Ion Insertion." *ACS Nano*, 3, pp. 907-914, (2009).
Lim, B.; Jiang, M.; Camargo, P. H. C.; Cho, E.C.; Tao, J.; Lu, X.; Zhu, Y. and Xia, Y., "Pd—Pt Bimetallic Nanodendrites with High Activity for Oxygen Reduction." *Sciences* 324, pp. 1302-1305, (2009).
Ji, X.; Lee, K. T. and Nazer, L. F., "A Highly Ordered Nanostructured Carbon—Sulphur Cathode for Lithium—Sulfur Batteries." *Nat. Mater.*, 8, pp. 500-506, (2009).
Cui, L.; Ruffo, R.; Chan, C. K.; Peng, H. and Cui, Y., "Crystalline-Amorphous Core-Shell Silicon Nanowires for High Capacity and High Current Battery Electrodes." *Nano Lett.*, 9, pp. 491-495, (2009).
Lang, J.; Kong, L.; Liu, M.; Luo, Y. and Kang, L., "Asymmetric Supercapacitors Based on Stabilized ~-Ni(OH)2 and Activated Carbon." *J. Solid State Electrochem.*, 14, pp. 1533-1539, (2010).
Ellis, B. L.; Lee, K. T. and Nazar, L. F., "Positive Electrode Materials for Li-Ion and Li-Batteries." *Chem. Mater.* 22, pp. 691-714, (2010).
Bakenov, Z. and Taniguchi, I., "Physical and Electrochemical Properties of LiMnPO4/C Composite Cathode Prepared with Different Conductive Carbons." *J. Power Sources* 195, pp. 7445-7451, (2010).
Kang, B. and Cedar, G., "Electrochemical Performance of LiMnPO4 Synthesized with Off-Stoichiometry." *J. Electrochem. Soc.* 157, pp. A808-A811, (2010).

(56) References Cited

OTHER PUBLICATIONS

Wang, H.; Robinson, J. T.; Diankov, G. and Dai, H., "Nanocrystal Growth on Grahene with Various Degrees of Oxidation." *J. Am. Chem. Soc.* 132, pp. 3270-3271, (2010).

Liang, Y.; Wang, H.; Casalongue, H. S.; Chen, Z. and Dai, H., "TiO2 Nanocrystals Grown on Graphene as Advanced Photocatalytic Hybrid Materials." *Nano Res.* 3, pp. 701-705, (2010).

Wang, H.; Sanchez Casalongue, H.; Liang, Y. and Dai, H., "Ni(OH)2 Nanoplates Grown on Graphene as Advanced Electrochemical Pseudocapacitor Materials." *J. Am. Chem. Soc.* 132, pp. 7472-7477, (2010).

Wang, H.; Cui, L.; Yang, Y.; Casalongue, H. S.; Robinson, J. T.; Lian, Y.; Cui, Y. and Dai, H., "Mn3O4-Graphene Hybrid as High-Capacity Anode Material for Lithium Ion Batteries." *J. Am. Chem. Soc.* 132, pp. 13978-13980, (2010).

Yang, S.; Cui, G.; Pang, S.; Cao, Q.; Kolb, U.; Feng, X.; Maier, J. and Mullen, K., "Fabrication of Cobalt and Cobalt Oxide/Graphene Composites: Towards High-Performance Anode Materials for Lithium Ion Batteries." *ChemSusChem* 3, pp. 236-239, (2010).

Ye, J.; Zhang, H.; Yang, R.; Li, X. and Qi, L., "Morphology-Controlled Synthesis of SnO2 Nanotubes by Using 1D Silica Mesostructures as Sacrifical Templates and Their Application in Lithium-Ion Batteries." *Small* 6, pp. 296-306, (2010).

Ban, C.; Wu, Z.; Gillaspie, D. T.; Chen, L.; Yan, Y.; Blackburn, J. L. and Dillon, A. C., "Nanostructured Fe3O4/SWNT Electrode: Binder-Free and High-Rate Li-Ion Anode." *AdV. Mater.*, 22, pp. E145-E149, (2010).

Wu, Z.; Ren, W.; Wen, L.; Gao, L.; Zhao, J.; Chen, Z.; Zhou, G.; Li, F. and Cheng, H., "Graphene Anchored with Co3O4 Nanoparticles as Anode of Lithium Ion Batteries with Enhanced Reversible Capacity and Cyclic Performance." *ACS Nano*, 4, pp. 3187-3194, (2010).

Zhou, G.; Wang, D.; Li, F.; Zhang, L.; Li, N.; Wu, Z.; Wen, L.; Lu, G. Q. and Cheng, H., "Graphene-Wrapped Fe3O4 Anode Material with Improved Reversible Capacity and Cyclic Stability for Lithium Ion Batteries." *Chem. Mater.*, 22, pp. 5306-5313, (2010).

Eda, G.; Lin, Y.; Mattevi, C.; Yamaguchi, H.; Chen, H.; Chen, I.; Chen, C. and Chhowalla, M., "Blue Photoluminescence from Chemically Derived Graphene Oxide." *AdV. Mater.* 22, pp. 505-509, (2010).

Wu, Z.; Ren, W.; Wang, D.; Li, F.; Liu, B. and Cheng, H., "High-Energy MnO2 Nanowire/Graphene and Graphene Asymmetric Electrochemical Capacitors." *ACS Nano*, 4, pp. 5835-5842, (2010).

An, X.; Simmons, T.; Shah, R.; Wolfe, C.; Lewis, K. M.; Washington, M.; Nayak, S.; Talapatra, S. and Kar, S., "Stable Aqueous Dispersions of Noncovalently Functionalized Graphene from Graphite and their Multifunctional High-Performance Applications." *Nano Lett.*, 10, pp. 4295-4301, (2010).

Wu, Z.; Wang, D.; Ren, W.; Zhao, J.; Zhou, G.; Li, F. and Cheng, H., "Anchoring Hydrous RuO2 on Graphene Sheets for High-Performance Electrochemical Capacitors." *Adv. Funct. Mater.*, 20, pp. 3595-3602, (2010).

Chen, P.; Chen, H.; Qiu, J. and Zhou, C., "Inkjet Printing of Single-Walled Carbon Nanotube/RuO2 Nanowire Supercapacitors on Cloth Fabrics and Flexible Substrates." *Nano Res.*, 3, pp. 594-603, (2010).

Ji, X. and Nazar, L. F., "Advances in Li—S Batteries." *J. Mater. Chem.* 20, pp. 9821-9826, (2010).

Yang, Y.; McDowell, M. T.; Jackson, A.; Cha, J. J.; Hong, S. S. and Cui, Y., "New Nanostructured Li2S/Silicon Rechargeable Battery with High Specific Energy." *Nano Lett.*, 10, pp. 1486-1491, (2010).

Kim, H.; Kim, S.; Park, Y.; Gwon, H.; Seo, D.; Kim, Y. and Kang, K., "SnO2/Graphene Composite with High Lithium Storage Capability for Lithium Rechargeable Batteries." *Nano Res.*, 3, pp. 813-821, (2010).

Hailiang Wang, et al., "Graphene-Wrapped Sulfur Particles as a Rechargeable Lithium—Sulfur Battery Cathode Material with High Capacity and Cycling Stability," Nano Lett., 11, pp. 2644-2647 (2011).

Hailiang Wang, et al., "$C_{o1-x}S$-Graphene Hybrid: A High-Performance Metal Chalcogenide Electrocatalyst for Oxygen Reduction," Angew. Chem. Int. Ed. 50, pp. 10969-10972 (2011).

Yanguang Li, et al., "$MoS_2$ Nanoparticles Grown on Graphene: An Advanced Catalyst for the Hydrogen Evolution Reaction," J. Am. Chem. Soc. 133, pp. 7296-7299 (2011).

Yongye Liang, et al., Covalent Hybrid of Spinel Manganese—Cobalt Oxide and Graphene as Advanced Oxygen Reduction Electrocatalysts, J. Am. Chem. Soc., pp. 1-8 (2012).

Hailiang Wang et al. "LiMn1-xFexPO4 Nanorods Grown on Graphene Sheets for Ultrahigh-Rate-Performance Lithium Ion Batteries." Angew. Chem. Int. Ed., vol. 50, pp. 1-6 (Jun. 27, 2011).

N. Nagarajan et al. "Cathodic Electrodeposition of MnOx Films for Electrochemical Supercapacitors." Electrochim. Acta, vol. 51, pp. 3039-3045 (Sep. 29, 2005).

Jong H. Jang et al. "Supercapacitor Performance of Hydrous Ruthenium Oxide Electrodes Prepared by Electrophoretic Deposition."J. Electrochem. Soc., vol. 153, pp. A321-A328 (2006).

* cited by examiner

STRONGLY COUPLED INORGANIC-GRAPHENE HYBRID MATERIALS, APPARATUSES, SYSTEMS AND METHODS

RELATED DOCUMENTS

This patent document is a continuation-in-part under 35 U.S.C. §120 of U.S. patent application Ser. No. 13/401,655, entitled "Graphene Hybrid Materials, Apparatuses, Systems and Method" and filed on Feb. 21, 2012, which also claims the benefit of the first three provisional applications listed in this statement; this patent document also claims benefit under 35 U.S.C. §119 to the following U.S. Provisional Patent Applications, Ser. No. 61/444,480, entitled "Nanomaterial/Graphene Hybrid Material" and filed on Feb. 18, 2011, Ser. No. 61/444,468, entitled "Nanocrystal-Graphene Hybrid Materials" and filed on Feb. 18, 2011, Ser. No. 61/600,400, entitled "Graphene Sheet-Based Materials, Apparatuses and Methods Therefor" and filed on Feb. 17, 2012, and Ser. No. 61/761,401, entitled "Strongly Coupled Inorganic-Nano-Carbon Hybrid Materials for Energy Storage" and filed Feb. 6, 2013; these patent documents and the Appendices filed in (and as part of) the underlying provisional applications, including the references cited therein, are fully incorporated herein by reference for their related teachings, common subject matter and priority-claim benefit therefor.

FEDERALLY-SPONSORED RESEARCH AND DEVELOPMENT

This invention was made with Government support under contract N00014-08-1-0860 awarded by the Office of Naval Research. The Government has certain rights in this invention.

BACKGROUND

As a single-atom-thick carbon material with light weight, high surface area and high conductivity, nanocarbon materials such as grapheme and carbon nanotubes have been useful for a variety of applications. However, these materials have been challenging to implement in certain applications. Moreover, while a variety of materials may be desirable to implement in various articles and electrical devices, the practicable implementation of such materials has been limited. For example, various nanomaterials are expensive, do not perform as well as desired, or exhibit certain characteristics that also make the materials difficult to work with and/or manufacture while achieving desirable performance. As another example, a variety of batteries have been implemented to store energy for electrical grids, and to propel vehicles, yet often do not provide desirable power output and energy capacity, can be expensive, and may pose various safety and environmental challenges. For instance, the global shift of energy production from fossil fuels to renewable energy sources requires more efficient and reliable electrochemical energy storage devices. In particular, the development of electric or hydrogen powered vehicles can be limited by the performance of batteries, supercapacitors and fuel cells.

These and other matters continue to present challenges to the implementation of graphene and other materials.

SUMMARY

Various example embodiments are directed to graphene-based materials, apparatuses, systems and methods, such as those mentioned above.

In accordance with various embodiments of the instant disclosure, covalent bonding and/or strong coupling conditions are determined and used for covalently bonding inorganic particles with a nanocarbon structure such as graphene or a carbon nanotube, based upon a characteristic of the inorganic particles. The covalently-bonded inorganic particles and nanocarbon structure form a hybrid conductor, which is coupled in a circuit. Such an approach is amenable, for example, to fabricating one or more electrodes and/or apparatuses, such as may be implemented with a battery or supercapacitor.

In various embodiments, covalent bonding and/or strong coupling refers to the nature of interaction between inorganic nanoparticles and oxidized nanocarbon including graphene and carbon nanotubes in the hybrid, formed by nucleating and growing nanoparticles on oxidized carbon substrates.

Another embodiment is directed to an apparatus having a nanocarbon electrode including at least one of graphene and carbon nanotubes, and inorganic particles covalently bonded to the nanocarbon electrode. The covalently-bonded electrode and/or inorganic particles form a hybrid conductor. The inorganic particles include at least one of nickel and iron, and are configured and arranged to facilitate the transfer of charge carriers with the nanocarbon electrode via the covalent bonds between the nanocarbon electrode and the inorganic particles. Such charge transfer is amenable to, for example, a Ni—Fe battery application.

The above discussion is not intended to describe each embodiment or every implementation of the present disclosure. The figures and following description also exemplify various embodiments.

BRIEF DESCRIPTION OF THE DRAWINGS

The disclosure may be more completely understood in consideration of the detailed description of various embodiments of the disclosure that follows in connection with the drawings, each being consistent with one or more of these embodiments, in which

FIGS. 2a-2f show nanoplates grown on a graphene-based sheet (GS) according to various embodiments of the present disclosure, and in which FIGS. 2a and 2b depict $Ni(OH)_2$/GS, FIG. 2c shows a low magnification image of $Ni(OH)_2$/GS, FIG. 2d depicts individual hexagonal $Ni(OH)_2$ nanoplates on GS, inset, fast Fourier transform of the lattice fringes in (d), FIG. 2e shows the thickness of an occasionally vertically aligned $Ni(OH)_2$ nanoplate, and FIG. 2f illustrates an XRD spectrum of a packed thick film of hexagonal $Ni(OH)_2$ nanoplates on GS;

FIGS. 3a-3d show $Ni(OH)_2$ nanoparticles formed on sheets, in accordance with one or more example embodiments in which FIGS. 3a and 3b depict $Ni(OH)_2$/GS, and FIGS. 3c and 3d respectively show low and high magnification images of $Ni(OH)_2$/GO with an inset shown of an electronic diffraction pattern of $Ni(OH)_2$ on GO;

FIGS. 4a-4f show $Ni(OH)_2$ nanoplates grown on GS, in accordance with one or more example embodiments in which FIG. 4a depicts a schematic drawing of $Ni(OH)_2$ nanoplates/GS composite packed on a Pt working electrode with an electrolyte, FIG. 4b shows CV curves of Ni(OH)$_2$ nanoplates/GS composite at various scan rates, FIG. 4c shows average specific capacitance of Ni(OH)$_2$ nanoplates grown on GS also at various scan rates, FIG. 4d shows average specific capacitance calculated from CV curves versus cyclic number of Ni(OH)$_2$ nanoplates grown on GS at a scan rate of 40 mV/s, FIG. 4e shows contact current discharge curves of Ni(OH)$_2$ nanoplates grown on GS at various discharge current densities, and FIG. 4f particularly shows the constant current charge and discharge curves of Ni(OH)$_2$ nanoplates grown on GS at a current density of 50 A/g;

FIGS. 6a-6d are plots showing XRD diffusion of composites by degree, consistent with other example embodiments in which FIG. 6a shows an as-made (first step reaction) GSl Ni(OH)$_2$.0.75H$_2$O, FIG. 6b shows hydrothermally derived (second step reaction) GS/Ni(OH)$_2$ composites, FIG. 6c shows XRD of as-made (first step reaction) composites on graphene, and FIG. 6d shows hydrothermally derived (second step reaction) composites;

FIGS. 7a-7d show scanning auger electron spectroscopy characterizations of hydrothermally-derived Ni(OH)$_2$/GS composite, in accordance with other example embodiments and in which FIG. 7a is an SEM image of several pieces of Ni(OH)$_2$/GS, FIG. 7b is an overlay of FIGS. 7c and 7d, and FIGS. 7c-7d show auger mapping of the structure of FIG. 7a for Ni and C elements;

FIGS. 8a-8f show SEM characterizations of GS/Fe$_2$O$_3$ and GO/Fe$_2$O$_3$ composites, consistent with example embodiments of the present disclosure in which FIGS. 8a-8b depict low and high magnification SEM images of an as-made GS/Fe$_2$O$_3$ composite, FIG. 8c shows an SEM image of the composite after hydrothermal reaction at 120° C., FIGS. 8d-8e show low and high magnification images of as-made GO/Fe$_2$O$_3$ after a first step of reaction at 80° C., and FIG. 8f shows an SEM image of the aforementioned composite after the second-step hydrothermal reaction at 120° C.;

FIGS. 9a-9d show a scanning auger electron spectroscopy characterization of hydrothermally-derived Fe$_2$O$_3$/GS composite, in accordance with further embodiments of the present disclosure in which FIG. 9a shows an SEM image of Fe$_2$O$_3$/GS, FIG. 9b depicts an overlay of FIGS. 9c-9d, FIGS. 9c-9d depict auger mapping of the structure of FIG. 9a for an Fe element of FIG. 9c;

FIGS. 10a-10f show SEM characterization of the GS/Co(OH)$_2$ and GO/Co(OH)$_2$ composites, consistent with other embodiments of the present disclosure in which FIGS. 10a-10b depict low and high magnification SEM images of an as-made GS/Co(OH)$_2$ composite, FIG. 10c shows an SEM image of this composite after hydrothermal reaction at 80° C., FIGS. 10d-10e show low and high magnification images of as-made GO/Co(OH)$_2$ after reaction at 50° C., and FIG. 10f shows an SEM image of the aforementioned composite after the second-step hydrothermal reaction at 80° C.;

FIGS. 11a-11d show scanning auger electron spectroscopy characterization of a hydrothermally-derived CoO(OH)/GS composite, consistent with other embodiments of the present disclosure in which FIG. 11a shows an SEM image of CoO(OH)/GS, FIG. 11b depict an overlay of FIGS. 11c-11d, FIGS. 11c-11d depicts auger mapping of the structure of FIG. 11a for Co and C, FIGS. 12a-12d depict an electrochemical characterization of Ni(OH)$_2$ nanoplates/GS composite, according to further embodiments of the present disclosure in which FIG. 12a shows CV curves of Ni(OH)$_2$ nanoplates/composite at various scan rates, FIG. 12b shows the average specific capacitance of Ni(OH)$_2$ nanoplates grown on GS at various scan rates, FIG. 12c graphs average specific capacitance, and FIG. 12d shows the CV curves of the Ni(OH)$_2$ nanoplates/composite;

FIGS. 13a-13d depict CV curves of hydrothermally-derived GO/Ni(OH)$_2$ composites at various scan rates, according to other embodiments of the present disclosure in which FIG. 13a shows a first-step reaction, FIGS. 13b and 13d show average specific capacitance of the as-made and hydrothermally-derived GO/Ni(OH)$_2$ composites, and FIG. 13c shows a second-step reaction of the of hydrothermally-derived GO/Ni(OH)$_2$ composites, FIGS. 14a-14d show SEM images and other graphs depicting Ni(OH)$_2$ nanoplates mixed with GS, according to other example embodiments of the present disclosure in which FIG. 14a shows an SEM image of hydrothermally derived Ni(OH)$_2$ nanoplates, FIG. 14b shows a mixture of the nanoplates with GS, and FIGS. 14c and 14d respectively show the CV curves and the average specific capacitance of the simple mixture at various scan rates;

FIGS. 19a-19c show respective electrode structures that may be implemented independently or together in accordance with one or more embodiments, in which FIG. 19a shows a graphene/iron-based nanoparticle hybrid, FIG. 19b shows a carbon nanotube/nickel-based nanoparticles hybrid, and FIG. 19c shows an implementation of the hybrid components in FIGS. 19a and 19b in a battery-type application;

Figure 1:
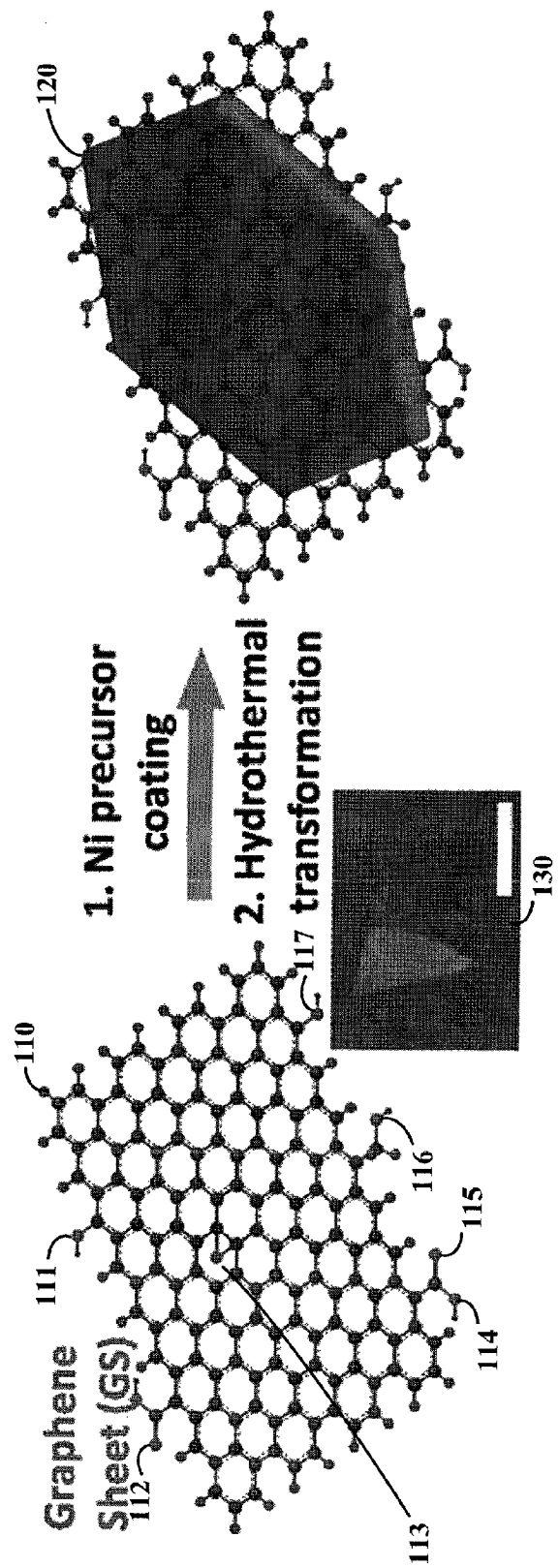
FIG. 1 shows a schematic two-step $Ni(OH)_2$ nanocrystal growth on graphene sheets, in accordance with one or more example embodiments.

While the disclosure is amenable to various modifications and alternative forms, specifics thereof have been shown by way of example in the drawings and are described in detail herein (and including in the Appendices filed in the underlying provisional application). It should be understood that the intention is not to necessarily limit the disclosure to the particular embodiments described. On the contrary, the intention is to cover all modifications, equivalents, and alternatives falling within the spirit and scope of the disclosure.

DETAILED DESCRIPTION

The present disclosure is related to methods and apparatuses directed to graphene-based methodologies and structures, such as those directed to power-density devices, energy storage, energy conversion, electron transport, electrodes, supercapacitors and batteries, as well as methods and devices in and stemming from the disclosures in the above-referenced patent documents to which benefit is claimed.

Various embodiments are directed to strongly coupled hybrids (SC-hybrids) of inorganic nanomaterials, to graphitic nanocarbon materials such as carbon nanotubes and graphene obtained through nucleation and growth of nanoparticles at functional groups of oxidized graphitic nanocarbon, and to related methods. The inorganic/nano-carbon hybrid materials are facilitated via chemical bonding between inorganic nanoparticles and oxidized carbon. Nanocarbon with various degrees of oxidation provides a substrate for nanoparticle nucleation and growth, which can be used in the formation of a variety of components. The interactions between inorganic precursors and oxidized-carbon substrate interactions are used to provide a degree of control over the morphology, size and structure of the resulting inorganic nanoparticles. Such approaches may be used for electrochemical energy storage and conversion, such as via preparation and functionalization of graphene sheets and carbon nanotubes to impart oxygen-containing groups and defects, and methods of synthesis of nanoparticles of various morphologies on oxidized graphene and carbon nanotubes. Various embodiments are directed to applications of SC-hybrid materials for high performance lithium ion batteries, rechargeable Li—S and Li—O$_2$ batteries, supercapacitors and ultrafast Ni—Fe batteries, and electrocatalysts for oxygen reduction, oxygen evolution and hydrogen evolution reactions.

Figure 7:
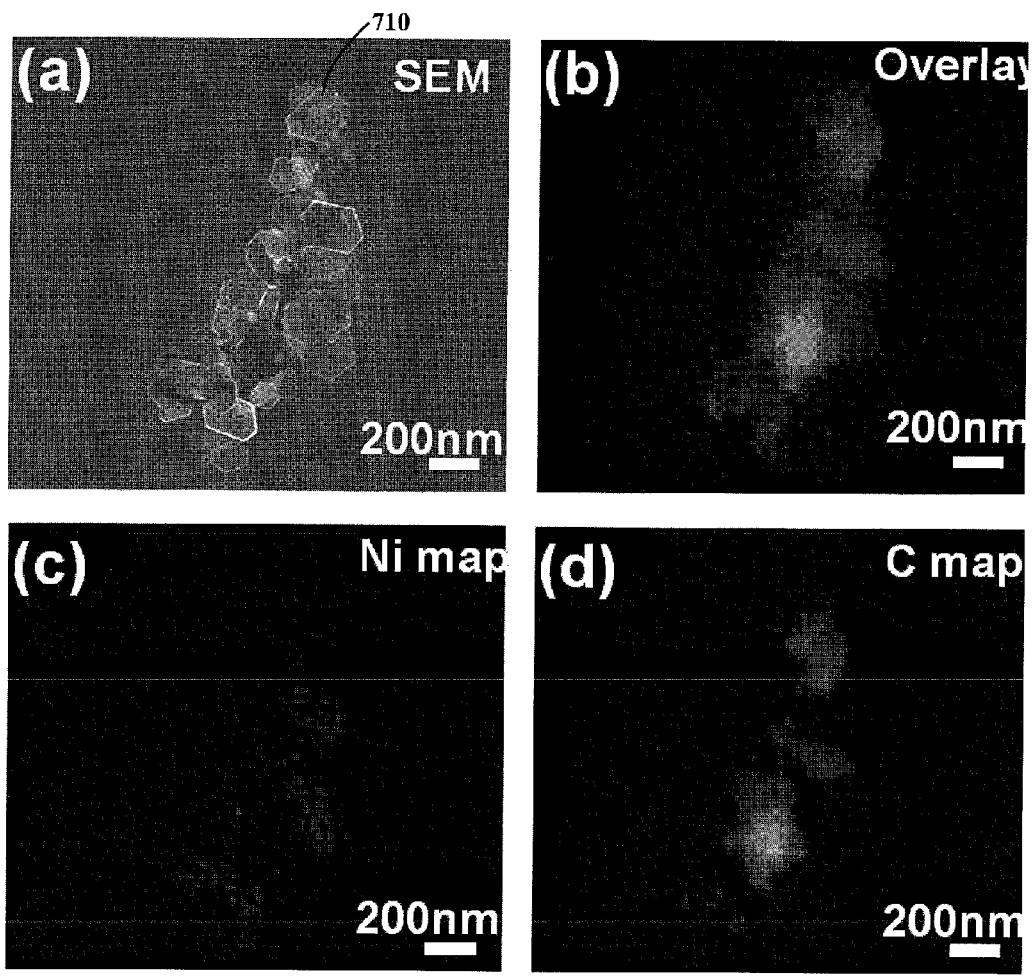

For general information regarding hybrid materials, and for specific information regarding hybrid materials and approaches to which one or more embodiments may be directed, reference may be made to Hailiang Wang and Hongjie Dai, "Strongly coupled inorganic-nano-carbon hybrid materials for energy storage," Chem. Soc. Rev., 2013, as in the above-identified Provisional Application Ser. No. 61/761,401 filed on Feb. 6, 2013, which is fully incorporated herein by reference for related teachings including, for example, embodiments directed to high-capacity anode materials for Li ion batteries as depicted in FIG. 7 and other figures therein, and including other embodiments directed to MnCo$_2$O$_4$/graphene hybrids, and to CNT/graphene hybrids for supercapacitors also as depicted and described therein in the figures such as FIGS. 12-13.

In accordance with one or more embodiments, an apparatus is manufactured as follows. For inorganic particles to be coupled with a nanocarbon structure, conditions are determined for covalently bonding the inorganic particles with the nanocarbon structure, based upon a characteristic of the inorganic particles. Determining such bonding conditions may involve, for example, determining and controlling oxygen content of the nanocarbon structure, crystalline structure of the nanocarbon structure, growth conditions of the inorganic particles such as those relating to temperature, solvent, precursors, and the presence of additives and post-treatments used to facilitate selective growth, strong coupling or bonding and other desirable properties of the hybrid materials. The determined covalent-bonding conditions are used to covalently bond inorganic particles to the nanocarbon structure, therein forming a hybrid conductor. This hybrid conductor is then coupled in a circuit, such as in a battery, supercapacitor, energy storage device, or other electrode-type circuit.

Covalent bonding/strong coupling of the inorganic particles and nanocarbon structure is carried out using one or more of a variety of approaches and respective materials. In some embodiments, inorganic nickel hydroxide and/or iron oxide particles are covalently bonded to a carbon nanotube structure or a graphene structure, and form an interface thereto. Such covalent bonding may, for example, be implemented via nucleation and growth as discussed above. Certain apparatuses employ respective interfaces having nickel hydroxide and iron oxide particles that are predominantly covalently-bonded to oxidize carbon nanotubes and a graphene oxide (RGO) sheet, respectively. Various applications are directed to using the covalent bonding/strong coupling to transfer electrons from an active material (e.g. the inorganic particles), to a current collector electrically through the nanocarbon structure coupled to the inorganic particles.

In accordance with one or more embodiments involving particles covalently-bonded to a graphene oxide sheet, the bonding is controlled using an oxidation characteristic of the graphene used to make the graphene oxide sheet. For instance, particles can be nucleated and covalently bonded at oxidized locations of the graphene, using controlled oxide characteristics at the locations to set the covalent bonding/strong coupling (e.g., controlling oxidation and functionalization of the nanocarbon structure). In certain embodiments, the inorganic particles are formed on oxidized portions of a graphene sheet, then recrystallized to form nanocrystals on the graphene sheet. Low oxidation can be used to facilitate inorganic particle diffusion and recrystallization (e.g., using precursor particles to facilitate formation of inorganic particles, then diffusing and crystallizing/recrystallizing the particles, such as via diffusion across a crystalline lattice). Similarly, inorganic particles can be grown on defective sites of the nanocarbon structure, or other targeted portions thereof. These approaches can be carried out, for example, while controlling the reaction temperature to set morphology of the nanocrystal structure and specific capacitance and charging/discharging rate capability of the resulting electrode. Similar approaches can be used with a carbon nanotube.

In accordance with other specific embodiments, inorganic particles are nucleated and grown on functional groups or defect sites on oxidized nanocarbon materials to achieve covalent bonding/strong coupling between particles and carbon, by controlling the synthesis of particles on nanocarbon. Materials synthesized in this manner are referred to as covalently bonded inorganic-carbon hybrids or strongly-coupled inorganic-carbon hybrids (SC-hybrid). As used herein, strongly-coupled refers to coupling via covalent bonding where the coupling is sufficiently strong to manifest the same bonding strength as a covalent bond, ceteris paribus. Covalent bonding/strong coupling conditions are determined and used for covalently bonded or strongly bonded inorganic particles with an oxidized nanocarbon structure such as graphene or a carbon nanotube, based upon a characteristic of the inorganic particles. Covalent bonding/strong coupling refers to the nature of interaction between inorganic nanoparticles and oxidized nanocarbon including graphene and carbon nanotubes in the hybrid formed by nucleating and growing nanoparticles on oxidized carbon substrates. The covalently-bonded inorganic particles and nanocarbon structure form a hybrid conductor, which is coupled in a circuit. Such an approach is amenable, for example, to fabricating one or more electrodes and/or apparatuses, such as may be implemented with a battery or supercapacitor.

Another type of embodiment is directed to an apparatus having a nanocarbon substrate including at least one of graphene and carbon nanotubes, and inorganic particles covalently bonded to the nanocarbon substrate. The covalently-bonded inorganic particles and nanocarbon substrate form a hybrid conductor. The inorganic particles include at least one of nickel and iron compounds, and facilitate the transfer of charge carriers with the nanocarbon substrate via the covalent bonds between the nanocarbon substrate and the inorganic particles. Such charge transfer is amenable to, for example, a Ni—Fe battery application.

A hybrid structure includes nanocrystals of active inorganic materials and at least a form of nano-carbons (graphene or carbon nanotube). The type of inorganic material can be selected for targeted functions. Desired performance of the hybrid structures can be achieved by building strong coupling between the inorganic particles and the nano-carbons and controlling the size and morphology of the particles, which are realized by functionalization of the nano-carbons and selective nucleation and growth of the nanocrystals on nanocarbon.

Various embodiments are directed to one or more of method-based approaches, such as in the manufacture or use of an apparatus, and the apparatus itself. In one embodiment, an apparatus includes a nanocarbon substrate including at least one of graphene and carbon nanotubes, and inorganic particles covalently bonded to the nanocarbon substrate. The resulting structure is a hybrid conductor in which the inorganic particles facilitate the transfer of charge carriers with the nanocarbon substrate via the covalent bonds between the nanocarbon substrate and the inorganic particles. Such approaches may be implemented, for example, with iron oxide particles covalently bonded to graphene as a first electrode (e.g., anode), and nickel hydroxide covalently bonded to carbon nanotubes as a second electrode (e.g., cathode). Such an apparatus may employ aspects as discussed above (e.g., oxidation and/or covalent bonding/strong coupling characteristics), and be implemented in a variety of applications such as with energy storage and conversion devices, which may include one or more of batteries, fuel cells, and supercapacitors (and, e.g., with related electrolyte/spacer material, as well as control and distribution circuitry).

In accordance with various embodiments, ultrafast rechargeable batteries are made from low-cost and abundant electrode materials operating in safe aqueous electrolytes, for electrochemical energy storage. Utilizing high specific power and high specific energy, such batteries are useful for a variety of power quality applications, such as to assist propelling electric vehicles that require fast acceleration and intense braking. Such batteries can also be used for the grid for rapid storage and release of energy. Accordingly, various such embodiments are directed to a nanocarbon material, such as graphene or carbon nanotubes, covalently bonded to nanoparticles that operate to facilitate charge transfer within the electrode material.

In a more particular embodiment, a battery-type apparatus includes an inorganic nanoparticle/graphitic nanocarbon (e.g., carbon nanotubes and graphene) hybrid material as an electrode material. Using such an approach with nickel hydroxide and iron oxide, desirable charging and discharging rates can be achieved (e.g., nearly 1.000-fold over other Ni—Fe batteries), while attaining high energy density. In some implementations, such an ultrafast Ni—Fe battery can be charged in about 2 minutes and discharged within about 30 seconds to deliver a specific energy of 120 Wh $kg^{-1}$ and a specific power of 15 kW $kg^{-1}$ based on the total mass of active materials.

Figures 19A, 19B, 19C:
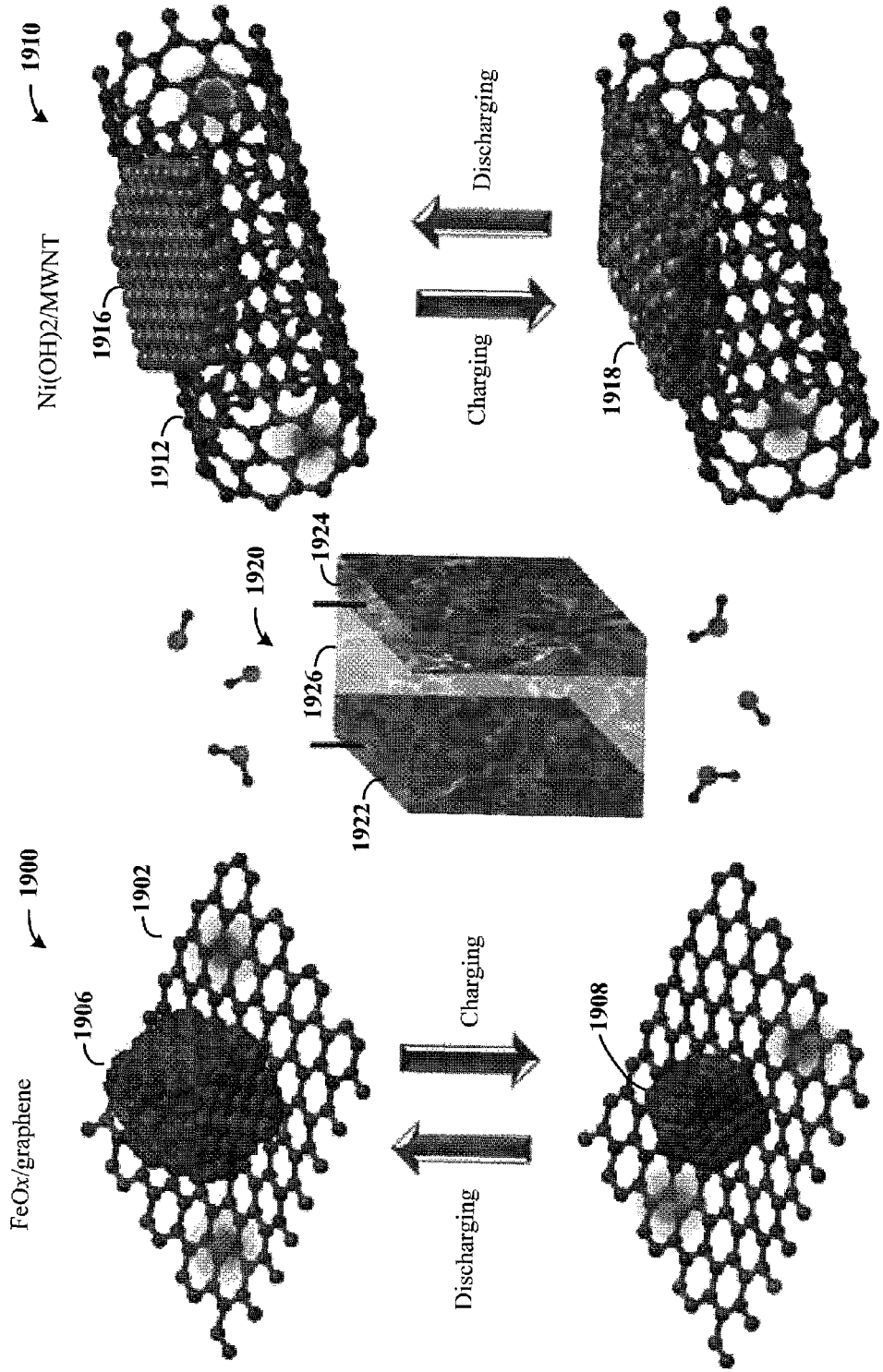

Turning now to the figures, and beginning with FIGS. 19a-19c, respective electrode structures are shown, which may be implemented independently or together in accordance with one or more embodiments. In particular, FIG. 19a shows a graphene/iron-oxide-based nanoparticle hybrid, FIG. 19b shows a multi-walled carbon nanotube (MWNT)/nickel-hydroxide-based nanoparticles hybrid, and FIG. 19c shows an apparatus 1920 including the hybrid components in FIGS. 19a and 19b in a battery-type application. Referring to FIG. 19a, an electrode 1900 includes a graphene plate 1902 covalently bonded to iron oxide (FeOx) nanoparticles 1906. Referring to FIG. 19b, an electrode 1910 includes a MWNT 1912 covalently bonded to Ni(OH)$_2$ nanoparticles 1916.

The electrodes shown in FIGS. 19a and 19b can be implemented for use with a variety of devices. For example, the Ni(OH)$_2$/MWNT hybrid apparatus shown in FIG. 19b is coupled with an electric double layer (EDL) capacitor-like electrode and implemented as a pseudo-capacitor electrode, in accordance with certain embodiments. FIG. 19c shows electrodes 1922 and 1924, separated by an electrolyte/separator 1926, in a battery-type application. Electrode 1922 may be implemented using electrode 1900, and electrode 1924 may be implemented using electrode 1910. The upper portion of FIGS. 19a and 19b show the respective electrodes in a discharged state, as implemented with such an application. The lower portion of FIGS. 19a and 19b show the respective electrodes in a charged state, in which the FeOx/graphene is converted to Fe/graphene and in which the Ni(OH)$_2$/MWNT is converted to NIOOH/MWNT, as shown with nanoparticles 1908 and 1918 respectively.

In some implementations, the Ni(OH)$_2$ in FIG. 19b includes a nanoplate grown on an oxidized MWNT as a cathode, and FeO$_x$ nanoparticles grown on reduced graphene oxide (RGO) sheets as the anode. Accordingly, a structure such as a battery may implement a multitude of such nanoplates and nanoparticles. In some implementation, the nanoparticles are electrochemically active inorganic nanomaterials directly grown on mildly oxidized portions of the nanocarbon materials (RGO or MWNTs). This growth is used to set strong covalent coupling/bonding between inorganic nanocrystals and carbon, leading to rapid electron transfer from active materials to current collectors. Such applications can achieve charging in about ~2 minutes and discharging in less than about 30 seconds, with a specific capacity of 115 mAh $g^{-1}$ based on the mass of the active materials, corresponding to an energy density greater than 120 Wh $kg^{-1}$ and a power density greater than 15 kW $kg^{-1}$. At a high current density of 37 A g$^{-1}$, the coulombic efficiency of such a Ni—Fe cell is nearly 100%.

The components shown in FIGS. 19a-19c can be manufactured in a variety of manners, to suit particular embodiments. In some embodiments, an Ni(OH)$_2$/MWNT hybrid cathode is synthesized by nucleating and growing nanocrystals on oxidized MWNTs (e.g., similar to the synthesis of Ni(OH)$_2$ on graphene sheets). In accordance with one or more embodiments, it has been discovered that conductivity of the graphene sheets and the covalent coupling with Ni(OH)$_2$ nanocrystals can be used to set the specific capacity and rate capability of the Ni(OH)$_2$ hybrid materials, as indicated via pseudocapacitive charge storage of Ni(OH)$_2$ nanocrystals supported on graphene sheets oxidized to various oxidation degrees. In various implementations, functional groups on the oxidized outer walls of the MWNTs interact with Ni$^{2+}$ to initiate nucleation and growth of Ni(OH)$_2$ nanocrystals, and intact inner walls of the MWNTs serve as highly conducting wires to provide desirable electrical wiring of the Ni(OH)$_2$ nanocrystals.

Figure 20:
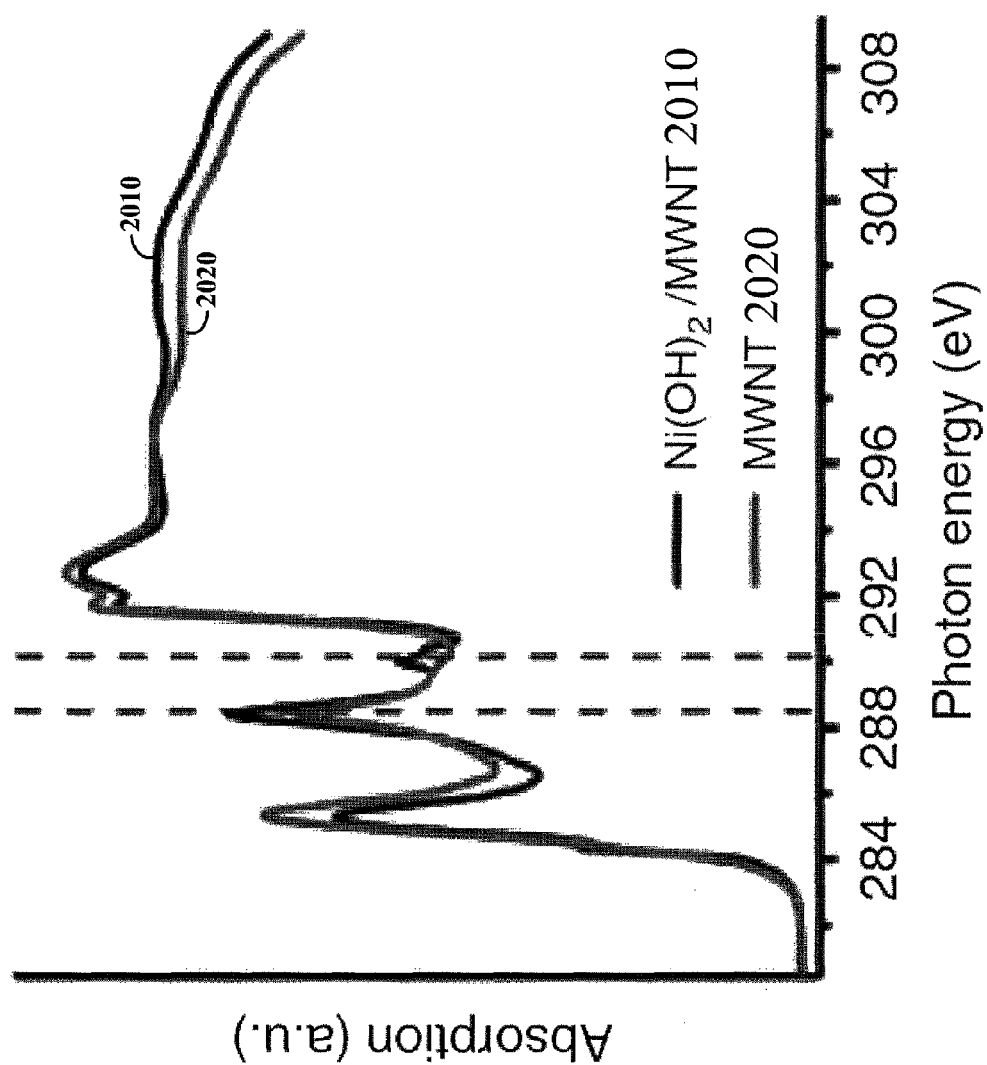
FIG. 20 shows plots of absorption versus photon energy for a nanotube/nickel-based hybrid structure, in accordance with another example embodiment.
Figure 21:
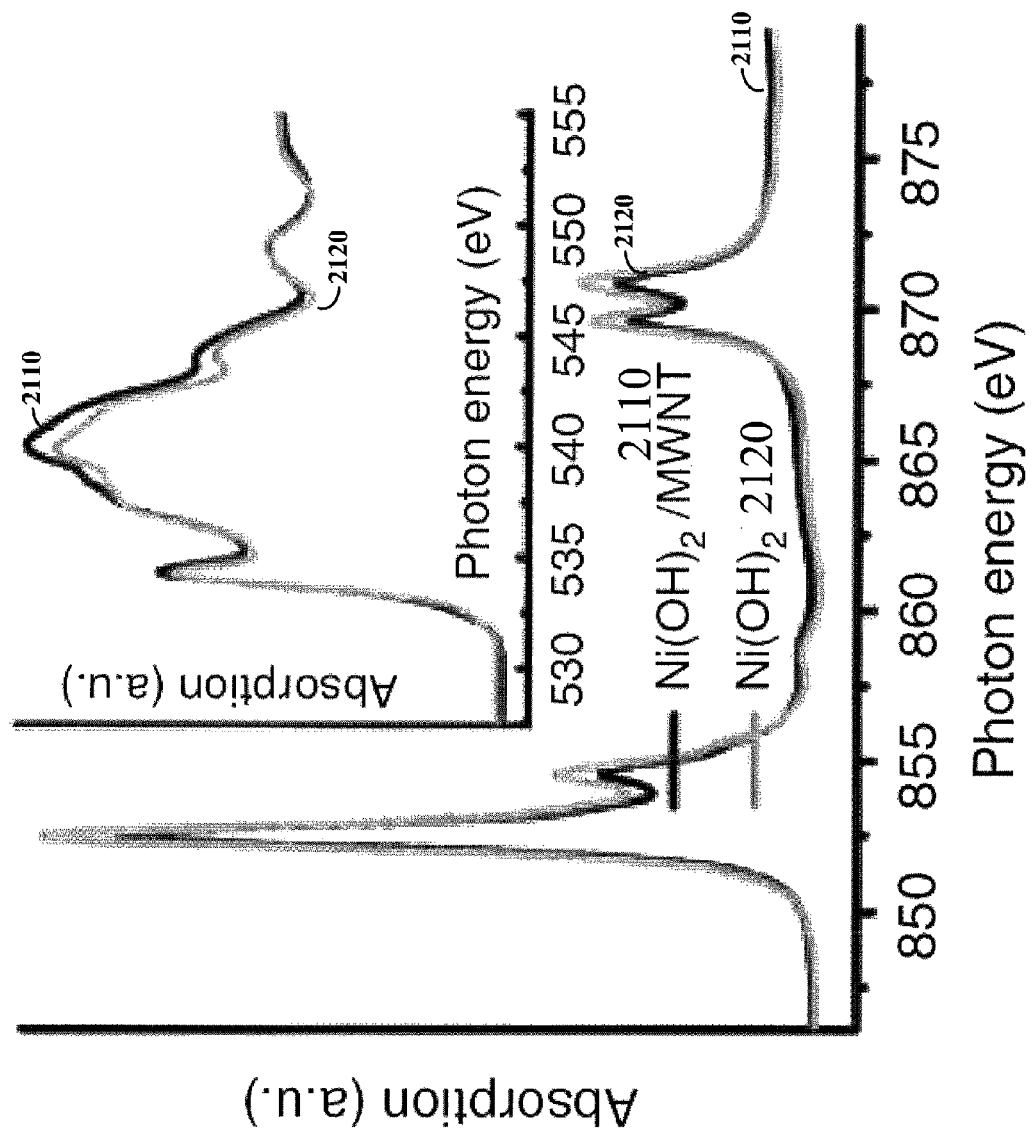
FIG. 21 shows plots of absorption versus photon energy for a nanotube/nickel-based hybrid structure, in accordance with another example embodiment.

In some implementations, Ni(OH)$_2$/MWNT hybrid materials are grown with crystalline β-Ni(OH)$_2$ nanoplates having irregular shapes interconnected by MWNTs. The nanoplates strongly interact with functional groups and defects on oxidized MWNTs. Such an approach can be used to form well-defined hexagonal Ni(OH)$_2$ nanoplates. As may be implemented with such an approach, FIGS. 20 and 21 show energy-ray absorption near edge structure (XANES) spectra for a Ni(OH)$_2$/MWNT hybrid structure, in accordance with one or more embodiments. In FIG. 20, plot 2010 shows carbon K-edge XANES spectrum for an Ni(OH)$_2$/MWNT, while reference plot 2020 shows the same for an oxidized MWNT. An increased absorption intensity is shown at 288.5 eV (carboxyl π*) and 290.3 eV (carbonate π*) at the carbon K-edge of the Ni(OH)$_2$/MWNT hybrid (relative to oxidized MWNTs without any metal exposure), as shown in FIG. 20.

Referring to FIG. 21, plots 2110 show nickel L-edge XANES spectrum for an Ni(OH)$_2$/MWNT, while reference plot 2120 shows the same for an Ni(OH)$_2$ nanoplate. The nickel L-edge absorption shows a +2 oxidation state of Ni in both the Ni(OH)$_2$/MWNT hybrid and the free Ni(OH)$_2$ nanoplate sample. A lower nickel L-edge and a higher oxygen K-edge of the hybrid sample suggest electron transfer from oxygen to nickel in the hybrid material.

In some implementations, FeO$_x$/graphene hybrid electrodes such as shown in FIG. 19A are synthesized using a solution phase reaction followed by a gas phase annealing step, in which Fe(OAc)$_2$ is hydrolyzed in a N,N-dimethylformamide (DMF)/water mixed solvent at 80° C. for coating graphene oxide (GO) sheets selectively and uniformly with nanoparticles. The intermediate product from the first step is mixed with glucose and annealed in Ar at 550° C. to reduce the GO and make crystalline FeO$_x$ particles on graphene. An FeO$_x$/graphene electrode is prepared by mixing an intermediate product from the reaction with glucose and polytetrafluoroethylene (PTFE), depositing into Ni foam, and then annealing in Ar at 550° C. The material can be loaded into Ni foam before high temperature annealing to afford hybrid materials uniformly dispersed and adhered to the Ni foam. In connection with one or more embodiments, it has been discovered that the addition of glucose can facilitate the stability of the resulting hybrid for electrochemical cycling. Cycling stability of the FeO$_x$/graphene hybrid electrode can be controlled or set by parameters such as KOH concentration of the electrolyte, Fe/C ratio of the hybrid, glucose additive, and annealing temperature. In particular, glucose addition to the FeO$_x$/graphene hybrid material followed by thermal annealing can improve cycling stability by mitigating aggregation of the FeO$_x$ nanoparticles.

Figure 22:
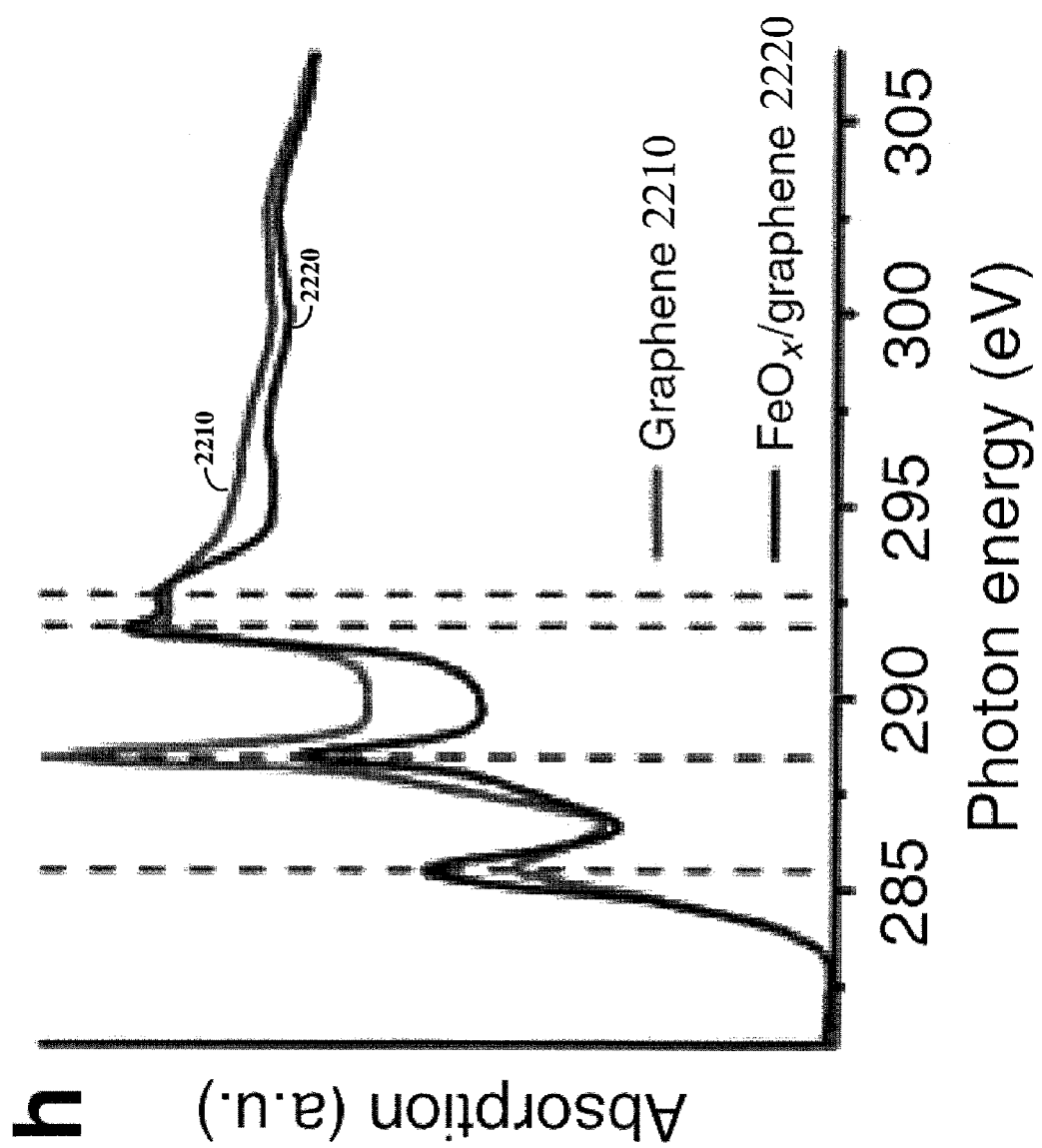
FIG. 22 shows plots of absorption versus photon energy for a graphene/iron-based hybrid structure, in accordance with another example embodiment.
Figure 23:
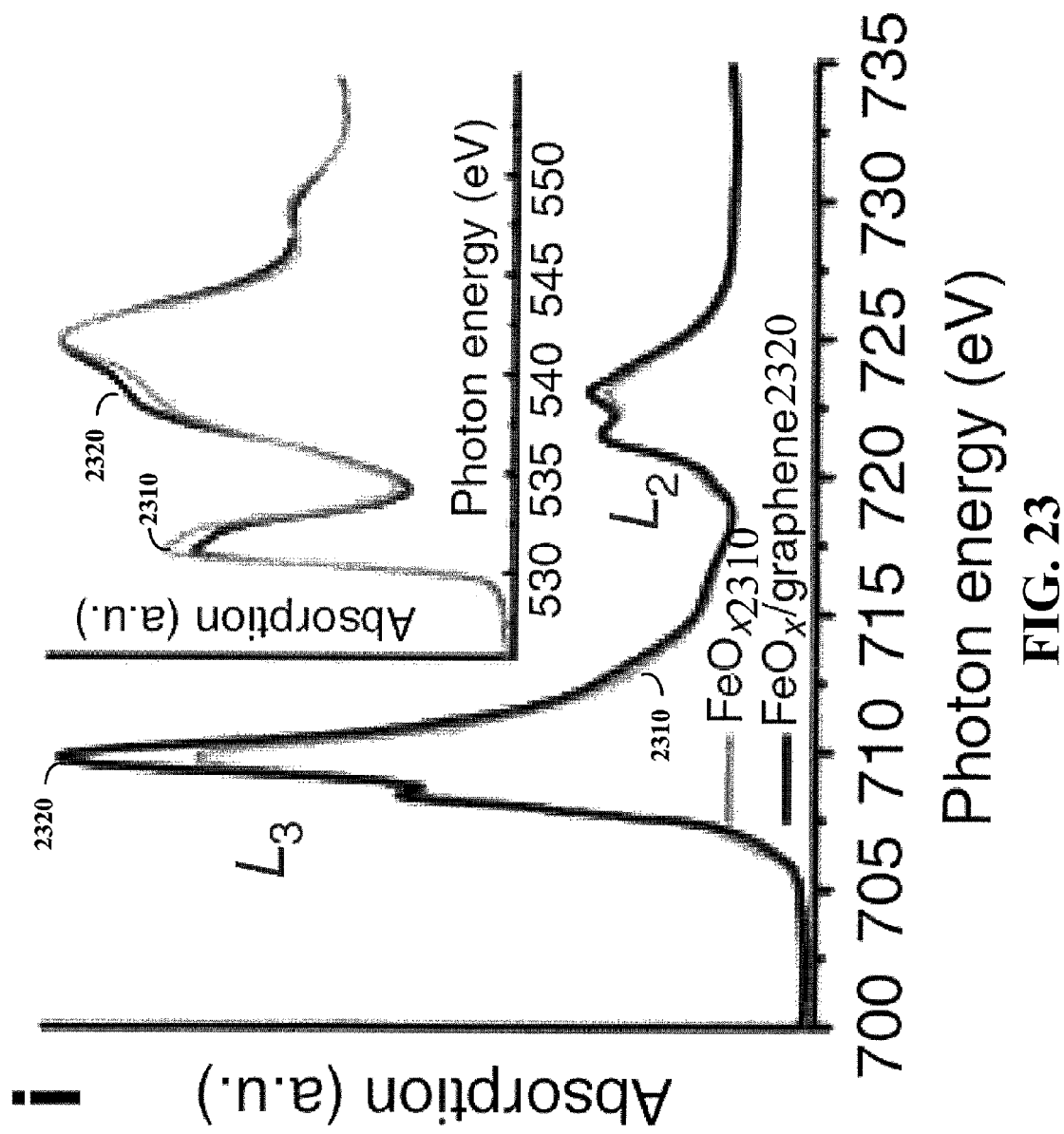
FIG. 23 shows plots of absorption versus photon energy for a graphene/iron-based hybrid structure, in accordance with another example embodiment.

FIGS. 22 and 23 show XANES spectra for a graphene/iron-oxide hybrid structure, in accordance with another example embodiment. In FIG. 22, plot 2210 shows data for a GO sample, and plot 2220 shows data for an FeO$_x$/graphene hybrid. This increased absorption shown in plot 2220 can be implemented using a higher π* density and thus enhanced sp$^2$ bonding characteristics. In some implementations, an absorption peak such as shown at 288.5 eV (carboxyl π*) near the carbon K-edge can be achieved using C—O functional groups in the reduced GO and covalent Fe—O—C bonding.

Referring to FIG. 23, plot 2310 shows a reference FeO$_x$ and plot 2320 shows an FeO$_x$/graphene hybrid. At the iron L-edge, the L$_3$ and L$_2$ peaks are consistent with the Fe$_3$O$_4$ phase. The increased iron L-edge and the decreased oxygen K-edge of the hybrid compared with the free FeO$_x$ control can be facilitated via an increase in the unoccupied electron density states at the O site, and a decrease in the unoccupied electron density states at the Fe site, consequently a higher ionic Fe—O bonding in the hybrid.

The apparatus shown in FIG. 19c can be manufactured using a variety of approaches. In some embodiments, a two-electrode ultra-Ni—Fe cell is fabricated using an Ni(OH)$_2$/MWNT hybrid material as discussed above as the cathode, and the FeO$_x$/graphene hybrid material as discussed above as the anode in 1 M KOH (e.g., 1.1 mg of Ni(OH)$_2$/MWNT and 0.7 mg of FeO$_x$/graphene can be loaded into 1 cm$^2$ Ni foams to form the electrodes). The mass ratio of Ni(OH)$_2$/FeO$_x$ is chosen to balance the cathode capacity with the anode capacity.

In addition to the above, one or more embodiments are directed to covalent-bonding aspects and/or circuit aspects as may relate to electrodes, batteries, supercapacitors and more, as described in Wang, et al., "An ultrafast nickel-iron battery from strongly coupled inorganic nanoparticle/nanocarbon hybrid materials," Nature Communications, Jun. 26, 2012, which, together with the supplemental materials published therewith, is fully incorporated herein by reference for related teachings including, for example, embodiments directed to the noted strongly coupled inorganic nanoparticle/nanocarbon hybrid materials materials for such batteries (see Appendix N of Provisional No. 61/600,400 filed Feb. 17, 2012). Accordingly, one or more embodiments may be implemented in connection with those described in Wang, et al.

Certain aspects of the disclosure are directed to carbon material used as substrates for various types of electronics manufacturing and/or electronic devices as described in the following and/or in connection with FIGS. 1-18. For example, as a single-atom thick carbon material with light weight and high surface area and conductivity, graphene-based substrates are used for growing and anchoring of single crystal structures. In some embodiments, one or more of these aspects are implemented, for example, together with one or more aspects as described above in connection with covalent-bonding characteristics, such as those described in connection with FIGS. 19a-23.

In some embodiments, different and/or additional types of inorganic particles are used in connection with the embodiments discussed herein. For example, cobalt oxide spinel oxide nanoparticles such as MnCo$_2$O$_4$ are covalently bonded to a nitrogen-doped nanocarbon structure. In some implementations, a hybrid conductor is formed by hydrolyzing CoAc$_2$ and MnAc$_2$, coating the hydrolyzed materials on graphene oxide, and solvothermally treating the graphene oxide to produce a hybrid Co$_2$MnO$_4$-graphene material. The graphene oxide may, for example be doped with nitrogen prior to such an approach. Such devices may be implemented in oxygen/reduction aspects.

More specific example embodiments are directed to apparatuses and methods involving graphene-based sheets with nanocrystals grown thereupon. Oxygen content (e.g., via oxidation) of a graphene sheet may be controlled to suit particular applications, such as by minimizing (e.g., mitigating or practically prohibiting) oxidation. In some embodiments, the oxygen content is controlled to facilitate the subsequent growth of single crystalline material on the graphene sheet, via the combination of nanoparticles on a surface of the graphene sheet. In such embodiments, the oxygen content is controlled to ensure that surface oxidation does not mitigate the nanocrystal growth. Such approaches may, for example, be carried out in connection with the approaches shown in and described in connection with Appendix A in the above-referenced patent document Ser. No. 61/444,480. The graphene sheets as discussed above and otherwise herein can be implemented in a variety of manners. Some embodiments are directed to graphene sheets that are in a planar-type arrangement. Other embodiments are directed to stacked graphene sheets. Still other embodiments are directed to rolled graphene sheets in the form of carbon nanotubes (e.g., single-walled nanotubes and/or multi-walled nanotubes).

According to certain specific embodiments and applications, single-crystalline particles are grown on graphene to facilitate a significantly enhanced electron transport rate, electrolyte contact area and structural stability, all of which facilitate fast energy storage and conversion applications. These nanocrystals (or related structures) interact with the graphene to form a hybrid-type material. Other aspects are directed to and involve the synthesis of nanocrystals on more pristine graphene with high electrical conductivity and controlling the morphologies of the nanocrystals for desired properties and applications. In one such application, a general two-step method is used to grow hydroxide and oxide nanocrystals of the iron family elements (Ni, Co, Fe) on graphene with various degrees of oxidation.

In certain embodiments, different nanocrystal growth behaviors are observed on low oxidation graphene sheets (GS) and highly oxidized GO in hydrothermal reactions. Small particles are pre-coated on GS diffused and recrystallized into single-crystalline nanoplates or nanorods with well-defined shapes.

Aspects of the present disclosure are directed to graphene plates having one or more different types of materials thereupon, as may be grown via nanocrystal growth described herein. Such materials may include, for example, graphene sheets in a generally one-dimensional format (e.g., in a planar shape), or graphene sheets in other shapes such as a tubular sheet (e.g., as in a graphene sheet rolled into a nanotube). Materials that may be coupled to such sheets (e.g., via nanocrystal growth as facilitated via oxidation/oxide growth limitation) include $Ni(OH)_2$, $Mn_3O_4$, $LiMn_{1-x}Fe_xPO_4$, $RuO_2$, $Co_3O_4$, $Co_2MnO_4$, $FeO_x$, $FeO_x$ doped with Ni, $MoS_2$, CoO, Ni—Fe layered double hydroxide, alpha-phase Ni hydroxide doped with Al and Co, and $CoS_x$.

Various embodiments are directed to a plurality of graphene sheets having $Ni(OH)_2$ structures grown thereupon, with the $Ni(OH)_2$/GS sheets being packed into thick layers to form electrochemical pseudo-capacitors with a stable capacitance>1000 F/g at an ultra-high discharge current density of 50 A/g. Such $Ni(OH)_2$/GS sheets may be referred to as nanoplates, having planar dimensions of several hundred nanometers with a thickness of a few (e.g., 10) nanometers. Full charging/discharging at a specific capacity of 156 mAh/g can be achieved in ~11 seconds. The high capacity and ultrafast rates are facilitated by the structure of electrochemically active $Ni(OH)_2$ structures on GS, allowing for efficient charging/discharging of individual in a macroscopic ensemble through the conducting, interconnected graphene network.

Other aspects of the present disclosure are directed to graphene-based materials and their implementation with a multitude of devices and systems. Various example embodiments are directed to supercapacitors, batteries such as lithium-ion and lithium-sulfur batteries, air electrodes and their implementation as metal-air batteries and fuel cells. Graphene-based materials such as the graphene-hybrid sheets discussed herein are implemented as an electrode or terminal with these devices and/or with systems employing the devices. For instance, a graphene-based sheet can be implemented as an anode or cathode, using one or more materials as discussed above.

Various example embodiments are directed to graphene sheets implemented as an electrode or terminal for a supercapacitor. The graphene sheet includes inorganic nanocrystals grown thereupon, with the graphene sheet being configured and arranged to collect current. The supercapacitor includes a second electrode and a separator between the first and second electrodes, the separator facilitating ion exchange between the electrodes.

In some embodiments, the active material is a pseudocapacitive material configured and arranged with the graphene sheet to exhibit specific capacitance and energy density that is higher than a specific capacitance and energy capacity of the graphene sheet. More particular embodiments are directed to supercapacitors in which the active structure includes $Ni(OH)_2$. In other particular embodiments, a plurality of such graphene sheets overlap one another to form a three-dimensional conducting network that transfers electrons between the graphene sheets and a separator.

Another embodiment is directed to an asymmetrical supercapacitor, with an electrode as having a graphene sheet with active structure thereupon as discussed above, and another electrode including a $RuO_2$ graphene hybrid material with $RuO_2$ grown on a graphene sheet. The electrodes are separated by a separator material. In some implementations, the active material in the first electrode includes $Ni(OH)_2$.

In accordance with another example embodiment, an energy-storage apparatus includes a hybrid structure including an anode and a cathode. The anode includes $FeO_x$ nanoparticles grown on a graphene sheet, and the cathode includes $Ni(OH)_2$ nanoplates grown on oxidized multi-wall carbon nanotubes (MWNTs). As variations, the anode is Ni doped $FeO_x$ nanoparticles grown on a graphene sheet, and the cathode includes alpha phase $Ni(OH)_2$ nanoplates doped with Al and Co grown on oxidized multi-wall carbon nanotubes (MWNTs).

Various example embodiments are directed to lithium-ion electrodes and batteries including a graphene-based sheet and material thereon as discussed herein. In one embodiment, a lithium-ion battery includes first and second electrodes separated by an electrolyte, with the first electrode including a graphene sheet and an active material grown on the graphene sheet. The electrolyte facilitates the passage of lithium ions between the electrodes.

A more particular example embodiment is directed to a lithium-ion electrode, such as discussed above, the active material includes $Mn_3O_4$ and is configured and arranged to interact with lithium ions from lithium-based material in the second electrode for passing charge carriers between the electrodes.

Another more particular example is directed to a lithium-ion electrode, such as discussed above, in which the active material includes $LiMn_{1-x}Fe_xPO_4$ Nanorods that facilitate diffusion of lithium charge carriers between the first and second electrodes.

In various embodiments, an electrode or terminal-type structure as discussed herein is formed as follows, with other embodiments directed to the electrode or terminal-type structure. Precursor particles are used to form nanoparticles at respective locations on a graphene sheet. In some implementations, the precursor particles are pre-coated on the graphene sheet. The nanoparticles are diffused and recrystallized to form a nanocrystal structure on a surface of the graphene sheet. The oxygen content of the graphene sheet can be set/selected or controlled to facilitate the nanocrystal growth, such as with a graphene sheet having less than 20% oxygen, with a graphene sheet having less than 10% oxygen, or a graphene sheet having less than 5% oxygen. Moreover, the graphene sheet can be implemented in a variety of forms, such as in a planar form or a ruled sheet form (e.g., as in a nanotube). In some embodiments, diffusing and recrystallizing the nanoparticles includes diffusing the nanoparticles across a graphitic lattice of the graphene sheet and recrystallizing the nanoparticles into single-crystalline structures.

As discussed herein, the term "precursor" is used to differentiate other materials or particles such as used to form nanoparticles, with the nanoparticles having a composition that is different than the precursor particles from which they are formed. As discussed herein, for instance, certain precursor particles would involve a reagent used to form nanoparticles of a different composition. As a more specific example, various embodiments are directed to using Ni precursor particles to form $Ni(OH)_2$ by reacting the Ni precursor particles with a solution-based material.

Diffusing and recrystallizing nanoparticles is carried out in different manners, depending upon the application. In some embodiments, the nanoparticles are diffused across a graphitic lattice of the graphene sheet and are recrystallized into single-crystalline structure. A plurality of such graphene sheets with structures thereupon (e.g., nanoplates) can be stacked to form an electrochemical pseudo-capacitor electrode. For example, the nanoparticles can be hydrothermally treated to form at least one of hydroxide, oxide, sulfide and selenide nanocrystals, respectively of at least one of the elements selected from the group of Ni, Co, Mn, Mo, Ru and Fe. Another embodiment is directed to gas phase reactions including thermal annealing at an elevated temperature in the presence of a gas flow of Ar, nitrogen, oxygen, ammonia, hydrogen sulfide, or other gases.

In addition to controlling/selecting the oxygen content (e.g., oxidation) of the graphene sheet, the reaction temperature of the recrystallization is controlled in connection with some embodiments, and therein used to control the morphology of a hybrid structure. This approach can also be used to improve specific capacitance and rate capability of an electrode material.

Various example embodiments are directed to graphene sheets implemented as an electrode with lithium-sulfur, such as for batteries and other electrode applications. A particular example embodiment is directed to a graphene-sulfur hybrid material. Such a material may be implemented as an electrode, such as a battery terminal.

A more particular embodiment is directed to a lithium-sulfur energy storage apparatus having an anode and a sulfur-graphene hybrid cathode. The hybrid cathode includes a plurality of porous graphene-based sheets, and sulfur impregnated in pores of the porous graphene-based sheets. The sulfur-impregnated graphene-based sheets are configured and arranged to trap polysulfides during charging and discharging of the energy storage apparatus.

Another particular embodiment is directed to a lithium-sulfur battery apparatus including an anode, a cathode and an electrolyte. The cathode includes a plurality of sulfur particles coated with poly(ethylene glycol), and for each sulfur particle, a plurality of graphene sheets coupled to the sulfur particle. Each graphene sheet has carbon black nanoparticles thereupon, and is configured and arranged to move relative to the sulfur particles as the sulfur particles change in volume during discharge of the battery. The electrolyte facilitates the passage of lithium ions between the anode and cathode.

Other example embodiments are directed to air electrodes, and to apparatuses such as batteries and/or fuel cells that employ the air electrode. The air electrodes include a graphene sheet and a catalyst structure grown on the graphene sheet. The graphene sheet and catalyst structure are configured and arranged for use as an electrode terminal of the air electrode. The graphene sheet is configured and arranged with the catalyst structure to catalyze at least one of an oxygen reduction reaction (ORR) and an oxygen evolution reaction (OER). In some implementations, the graphene sheet is doped, such as with nitrogen or otherwise n-doped.

In a more particular embodiment, an apparatus employing the air electrode is a fuel cell having the air electrode, an electrolyte and a fuel electrode. The electrode terminal is configured and arranged to interact with air in the exchange of exchange ions with the fuel electrode via the electrolyte.

In another particular embodiment, an apparatus employing the air electrode is a battery having the air electrode as a cathode, an anode and an electrolyte. The air electrode terminal interacts with air to generate charge carriers, and facilitates the transport of the charge carriers to the electrode via the electrolyte.

A variety of materials may be used with the air electrode. In connection with various example embodiments, the catalyst structure includes one or more of $Co_3O_4$, $Co_{1-x}S$, $Mn_2CoO_4$, $MnO_x$, NiFe double layer hydroxide, and CoO covalently grown on nanocarbon. The catalyst structure may be implemented to catalyze an ORR or OER as discussed above. In various embodiments, the graphene sheet is a rolled sheet in the form of a nanotube.

Other more specific embodiments are directed to lithium-air electrodes, such as for rechargeable $Li-O_2$ Batteries. In such embodiments, the catalyst structure includes $Co_2MnO_4$, and the graphene sheet is configured and arranged with the $Co_2MnO_4$ to catalyze at least one of an oxygen reduction reaction (ORR) and an oxygen evolution reaction (OER).

Other example embodiments are directed to hydrogen reduction electrodes and/or apparatuses. One such embodiment is directed to an apparatus having a graphene sheet and $MoS_2$ nanoparticles grown on the graphene sheet. The $MoS_2$ nanoparticles and graphene sheet catalyze a hydrogen evolution reaction. In some implementations, the graphene sheet with the $MoS_2$ nanoparticles thereupon are coupled to an electrode of a hydrogen reduction cell.

Turning now to the figures, FIG. 1 shows a schematic multi-step (e.g., two-step) process in which $Ni(OH)_2$ nanocrystals are grown on graphene sheets, consistent with embodiments of the present disclosure. By way of example, a single graphene sheet 110 is shown in which the oxygen content thereof is controlled/limited to a few locations as labeled by way of example at 111-117. After a first step of reaction in which a Ni precursor is coated on the graphene sheet 110, a coating of $Ni(OH)_2 0.75H_2O$ is obtained. In connection with various embodiments, it has been observed/ discovered that after the second step of reaction (hydrothermal transformation), the coating on the graphene sheet diffuses and recrystallizes into large single crystalline hexagonal $Ni(OH)_2$ structures 120, while such a coating on graphene oxide (e.g., greater that 5% or greater than 10% oxygen) remains as small nanoparticles pinned by functional groups on defects on the graphene oxide surface. The structure 120 may be referred to as a nanoplate, having a generally one-atom thickness and extending along the graphene sheet in a generally parallel (planar) arrangement.

Using this approach, a variety of inorganic nanomaterials can be grown on a graphene sheet or carbon nanotube. Accordingly, the oxygen content (e.g., oxidation) of the graphene sheet can be controlled (e.g., limited) to facilitate single-crystalline growth along a lattice structure of the graphene sheet, therein mitigating effects of oxidation upon the nanocrystal growth. The inset 130 shows an SEM image of the sheet.

Figure 2:
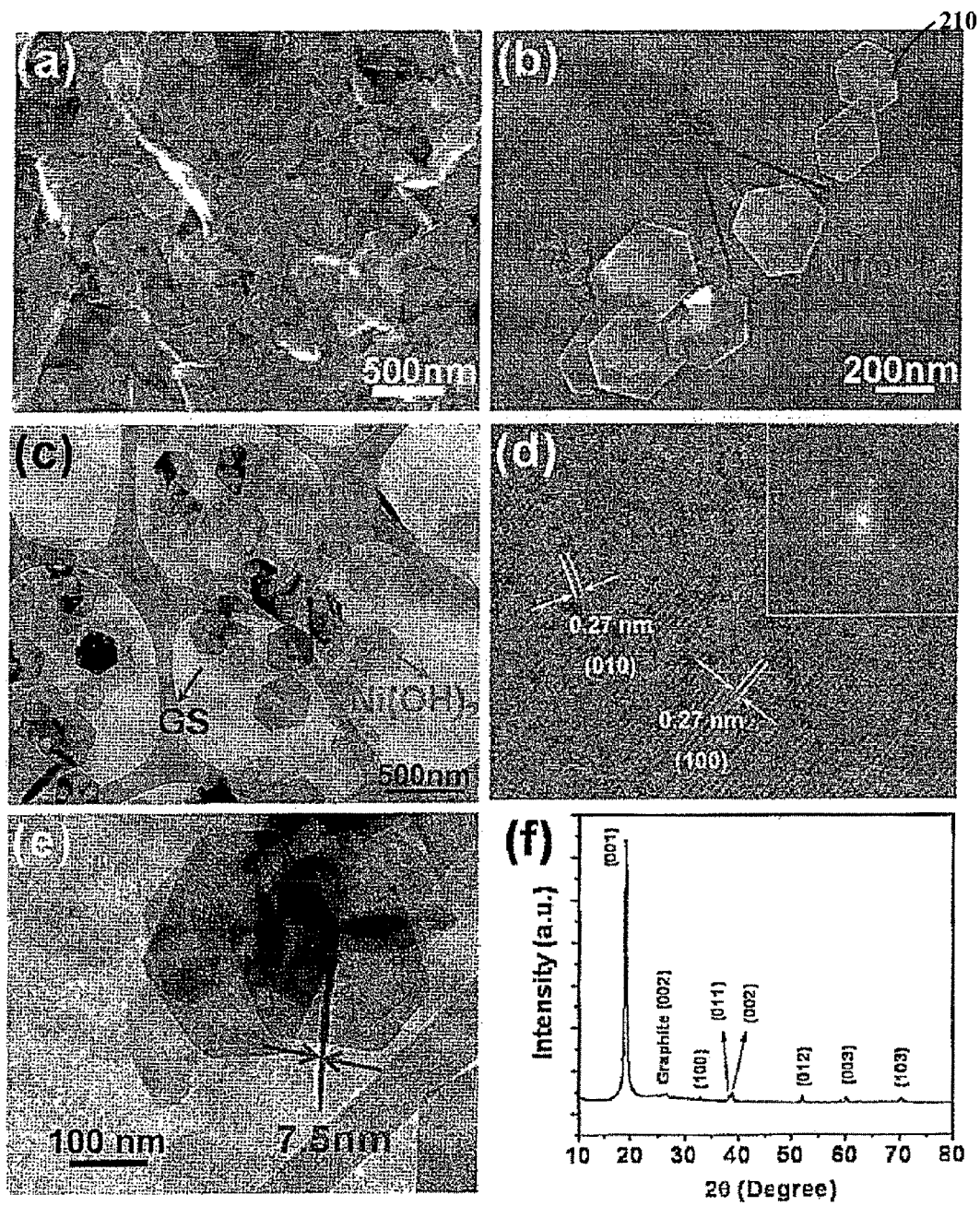

FIG. 2 shows hexagonal $Ni(OH)_2$ structures grown on graphene sheets (GS) and a related spectrographic plot, according to other embodiments of the present disclosure. FIGS. 2a and 2b depict SEM images of $Ni(OH)_2$/GS at different magnification levels, with an $Ni(OH)_2$ plate 210 labeled by way of example. FIG. 2c shows a low magnification TEM image of $Ni(OH)_2$/GS, in which $Ni(OH)_2$ nanoplates are supported on graphene sheets over holes on TEM grid. FIG. 2d depicts a high resolution TEM image of individual hexagonal $Ni(OH)_2$ nanoplates on GS, with the inset showing a fast Fourier transform of the lattice fringes in (d) and exhibiting hexagonal symmetry of the two-dimensional lattice of β-$Ni(OH)_2$ perpendicular to the (001) zone axis. FIG. 2e is a TEM image that shows the thickness of an occasionally vertically aligned $Ni(OH)_2$ nanoplate. FIG. 2f illustrates an x-ray diffractometry (XRD) spectrum of a packed thick film of hexagonal $Ni(OH)_2$ nanoplates on GS.

Figure 3:
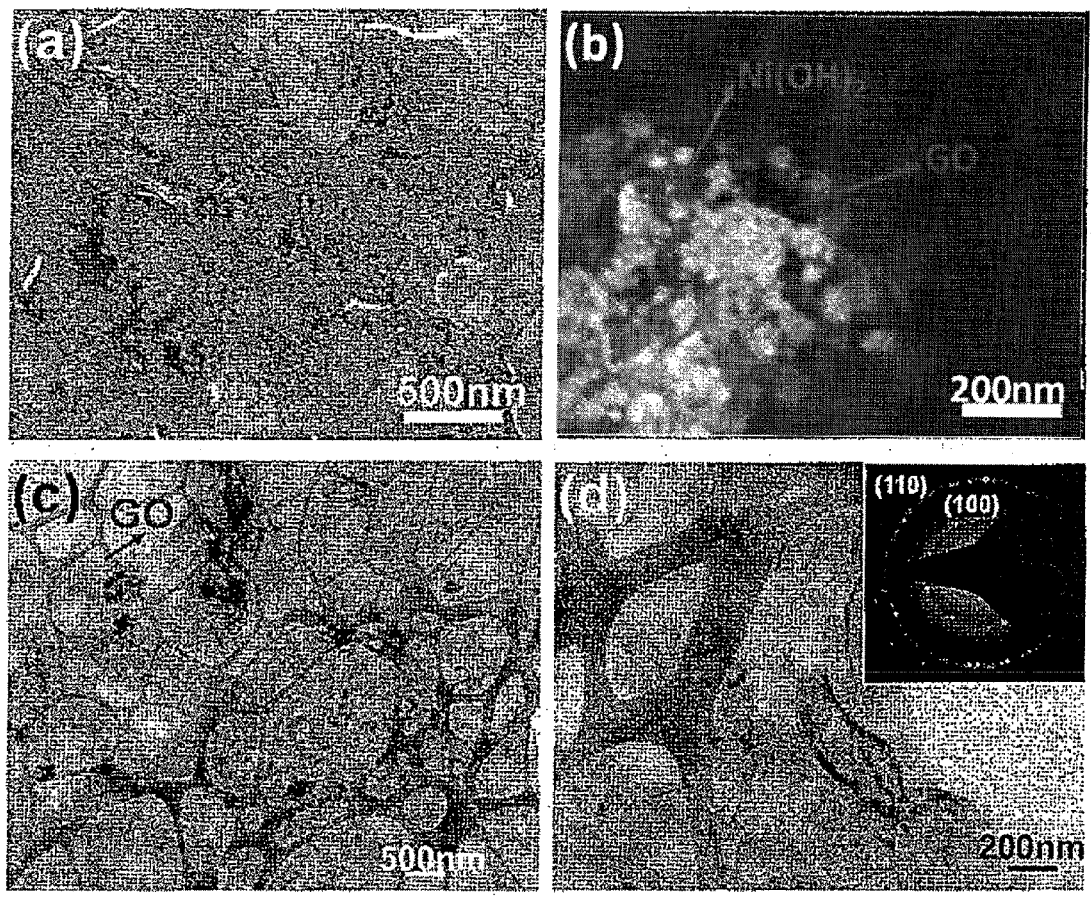

FIG. 3 shows $Ni(OH)_2$ nanoparticles formed on GO, consistent with other alternate embodiments of the present disclosure. FIGS. 3a and 3b depict SEM images of $Ni(OH)_2$/GO structures 310 and 320, and FIGS. 3c and 3d show low and high magnification TEM images of $Ni(OH)_2$/GO structures 330 and 340, with FIG. 3d showing an inset of an electronic diffraction pattern of $Ni(OH)_2$ on GO in (110) and (100) directions. For instance, FIG. 3b shows GO 322 and $Ni(OH)_2$ 324.

Figure 4:
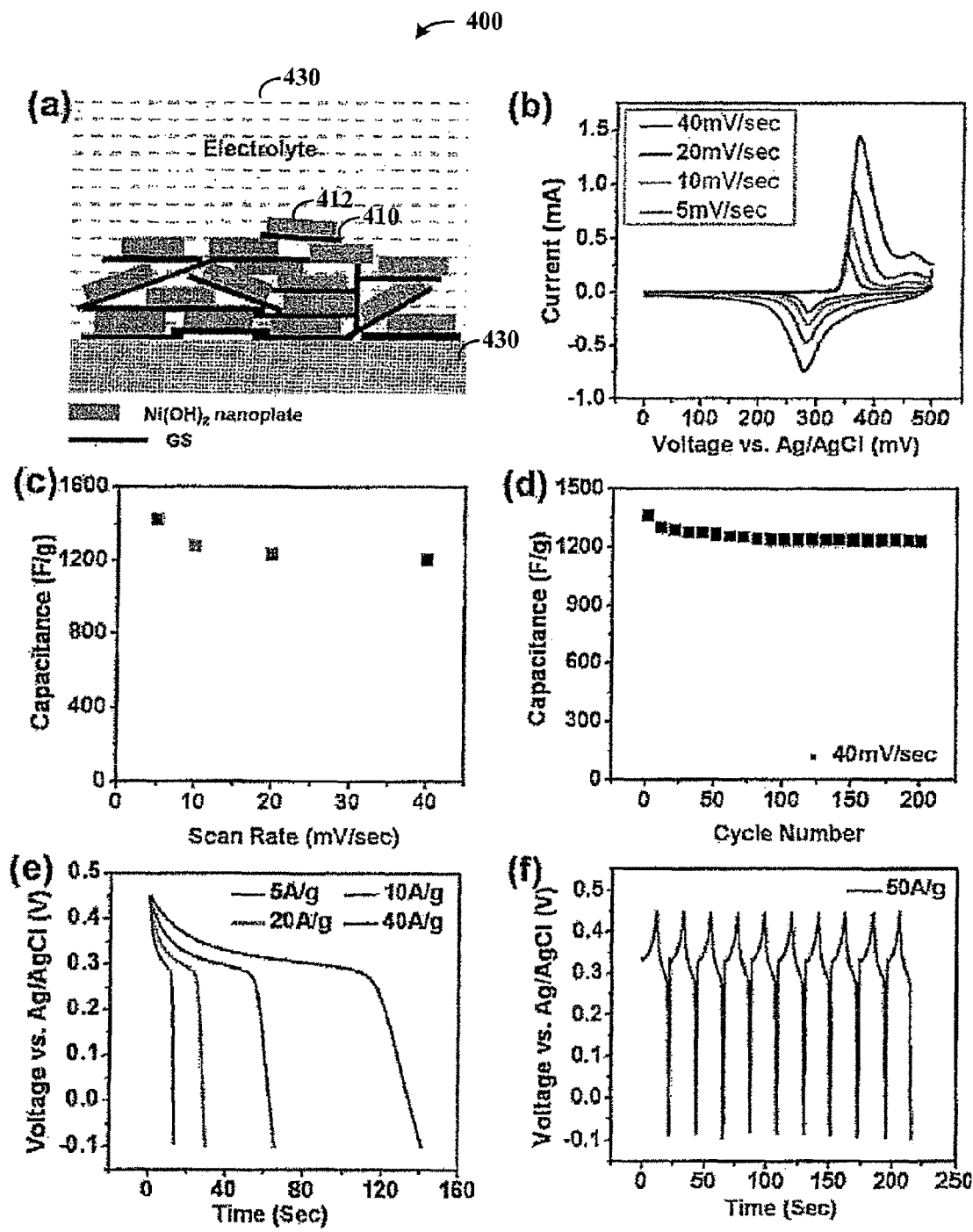

FIG. 4 shows an electrode 400 with $Ni(OH)_2$ nanoplates grown on GS as a high performance material for energy storage and conversion, consistent with additional embodiments of the present disclosure. Beginning with FIG. 4a, $Ni(OH)_2$ nanoplates/GS composite structures are packed on the Pt working electrode with an electrolyte, such as may be implemented with a supercapacitor or ion battery device. By way of example, graphene sheet 410 is labeled, and which has $Ni(OH)_2$ nanoplate 412 formed thereupon, with several of the nanoplate/graphene sheet structures stacked on a Pt electrode 430. The stacked structure is further exposed to an electrolyte 430 and exchanges ions therewith.

FIG. 4b shows CV curves of $Ni(OH)_2$ nanoplates/GS composite shown in FIG. 4a, at various scan rates. FIG. 4c graphs average specific capacitance of the $Ni(OH)_2$ nanoplates grown on GS also at various scan rates. FIG. 4d shows average specific capacitance calculated from CV curves versus cyclic number of the $Ni(OH)_2$ nanoplates grown on GS at a scan rate of 40 mV/s. FIG. 4e shows contact current discharge curves of the $Ni(OH)_2$ nanoplates grown on GS at various discharge current densities, whereas FIG. 4f particularly shows the constant current charge and discharge curves of $Ni(OH)_2$ nanoplates grown on GS at a current density of 50 A/g.

Figure 5:
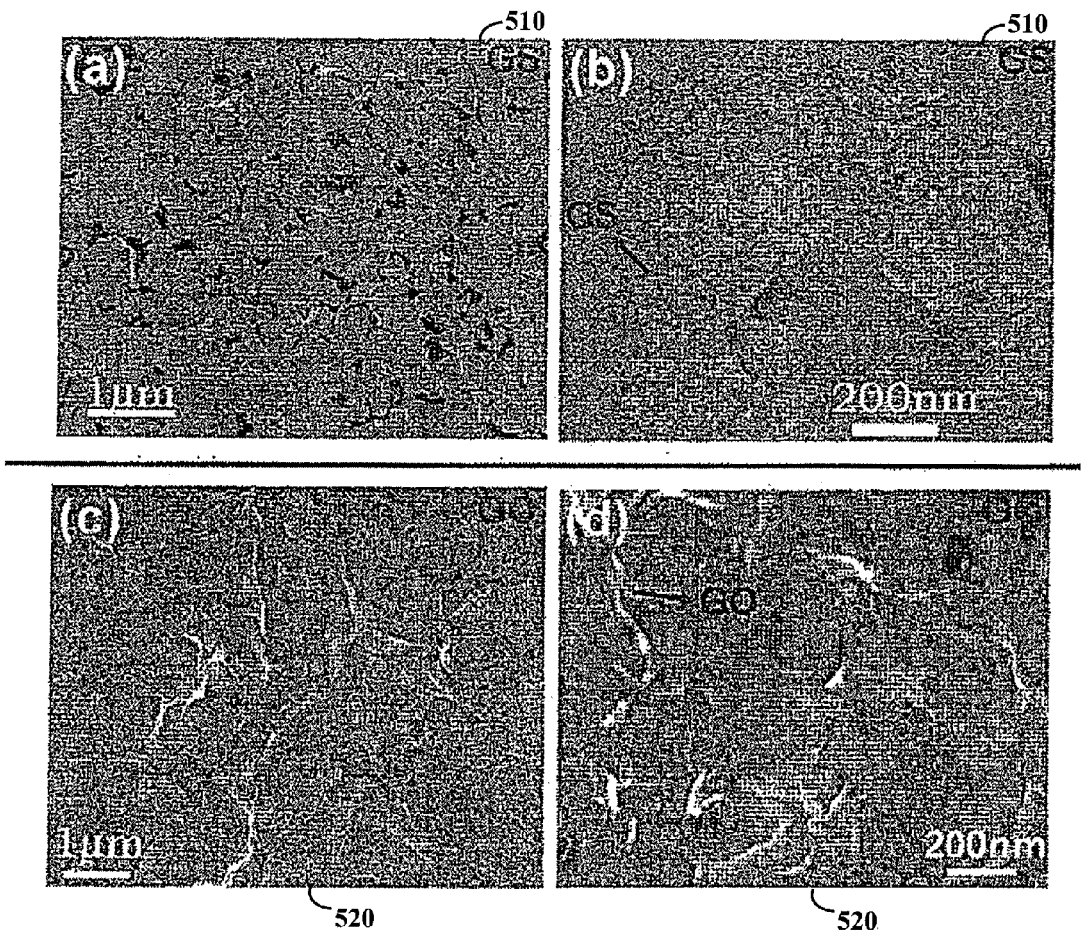
FIGS. 5a, 5b, 5c, and 5d show SEM images of as-made GS/Ni(OH)$_2$, in accordance with another example embodiment.

FIG. 5 shows SEM images of as-made GS/$Ni(OH)_2$, consistent with other embodiments of the present disclosure. After the first step of reaction at 80° C., an aqueous $Ni(Ac)_2$ solution is injected to the GS (GO)/DMF suspension that was preheated to 80° C. Small nanoparticles are uniformly coated on both GS 510 (see, FIGS. 5a-5b), and GO 520 (see, FIGS. 5c-5d) by hydrolysis of the precursor, as shown with different magnification.

Figure 6:
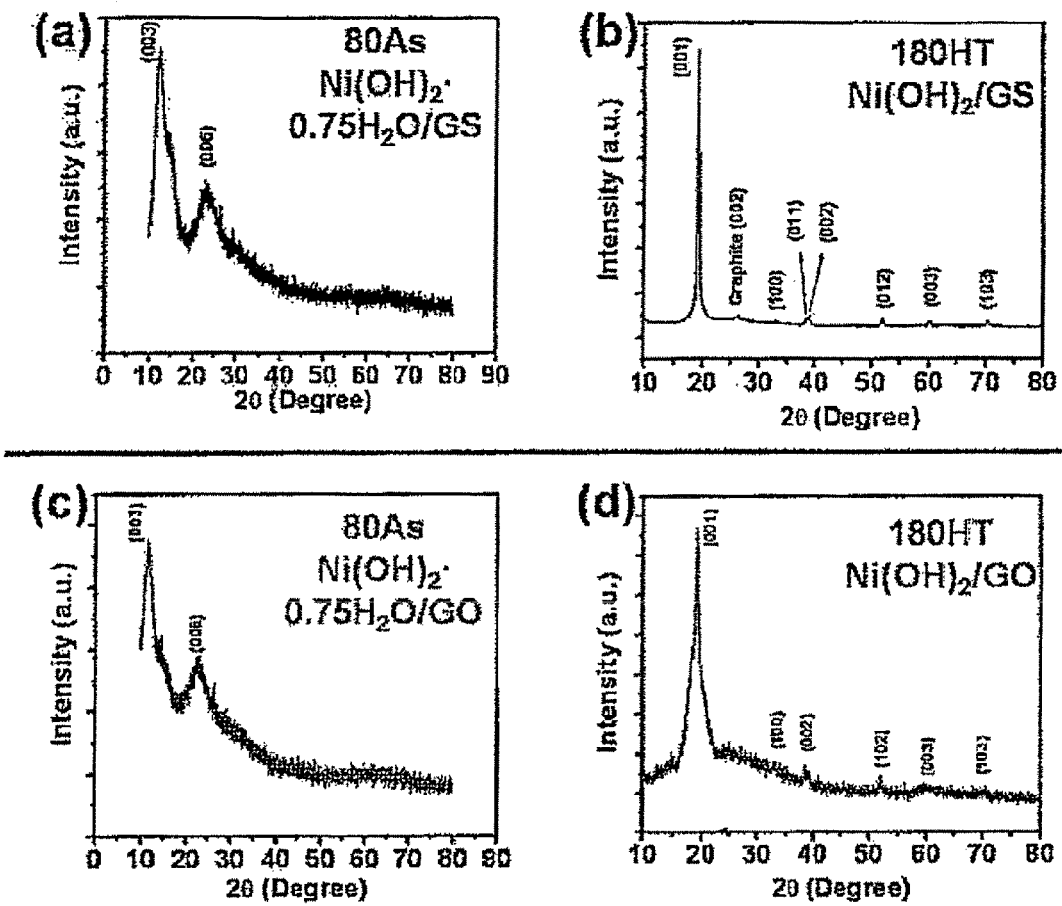

FIG. 6 shows XRD diffusion plots of composites by degree, consistent with other embodiments of the present disclosure. Consistent with one or more detailed/experimental embodiments, XRD of (FIG. 6a) as-made (first step reaction) GSl $Ni(OH)_2$.0.75$H_2O$ and (FIG. 6b) hydrothermally derived (second step reaction) GS/$Ni(OH)_2$ composites. (FIG. 6c) XRD of as-made (first step reaction) and (FIG. 6d) hydrothermally derived (second step reaction) GO/nickel composites. After the first step of reaction at 80° C., both the GS and GO composites showed weak and broad peaks, corresponding to the same structure of small nanoparticles of $Ni(OH)_2$.0.75$H_2O$ on the sheets. After the second-step hydrothermal reaction at 180° C., the products were $Ni(OH)_2$ as shown by XRD. The nanoplate $Ni(OH)_2$/GS composite showed stronger and narrower peaks than the nanoparticle $Ni(OH)_2$/GO composite due to higher degree of crystallinity and large single crystal sizes of the nanoplates.

FIG. 7 shows a scanning auger electron spectroscopy characterization of hydrothermally-derived $Ni(OH)_2$/GS composite, consistent with another embodiment of the present disclosure. Referring to FIG. 7a, an SEM image of several pieces of $Ni(OH)_2$/GS is shown, with graphene sheet 710 labeled by way of example. FIGS. 7c-7d show auger mapping of the structure of FIG. 7a for Ni (blue signal) and C (green signal) elements as respectively shown in FIGS. 7c (Ni) and 7d (C).

Figure 8:
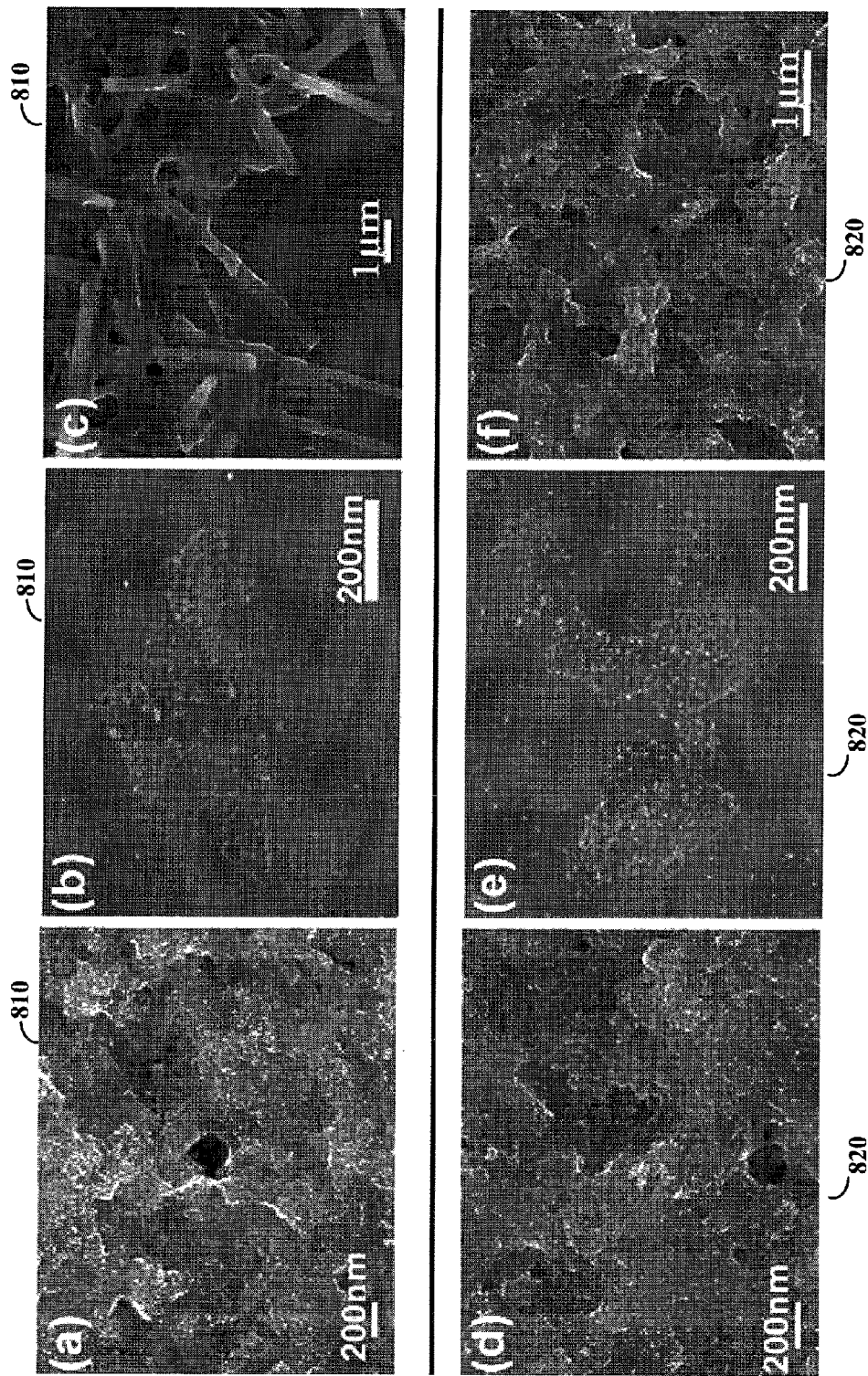

FIG. 8 shows SEM characterization of GS/$Fe_2O_3$(810) and GO/$Fe_2O_3$(820) composites, consistent with alternative embodiments of the present disclosure. Specifically, FIGS. 8a-8b depict low and high magnification SEM images of as-made GS/$Fe_2O_3$ composite 810 after first step of reaction at 80° C., and FIG. 8c shows an SEM image of this composite after the second-step hydrothermal reaction at 120° C. FIGS. 8d-8e show low and high magnification images of as-made GO/$Fe_2O_3$ 820 after first step of reaction at 80° C., and FIG. 8f shows an SEM image of the aforementioned composite after the second-step hydrothermal reaction at 120° C. After the first step of reaction, both the GS and GO were densely coated with small nanoparticles, showing the same morphology. However, after a second-step hydrothermal transformation reaction as discussed above, the small particles on GS transformed into nanorods on GS, while the coating on GO remained as small particles. As consistent with the above-discussed observation/discovery, controlling the oxygen content of the graphene sheets facilitates nanorod growth, whereas more heavily oxidized graphene (e.g., greater than 10% oxygen) limits such growth.

Figure 9:
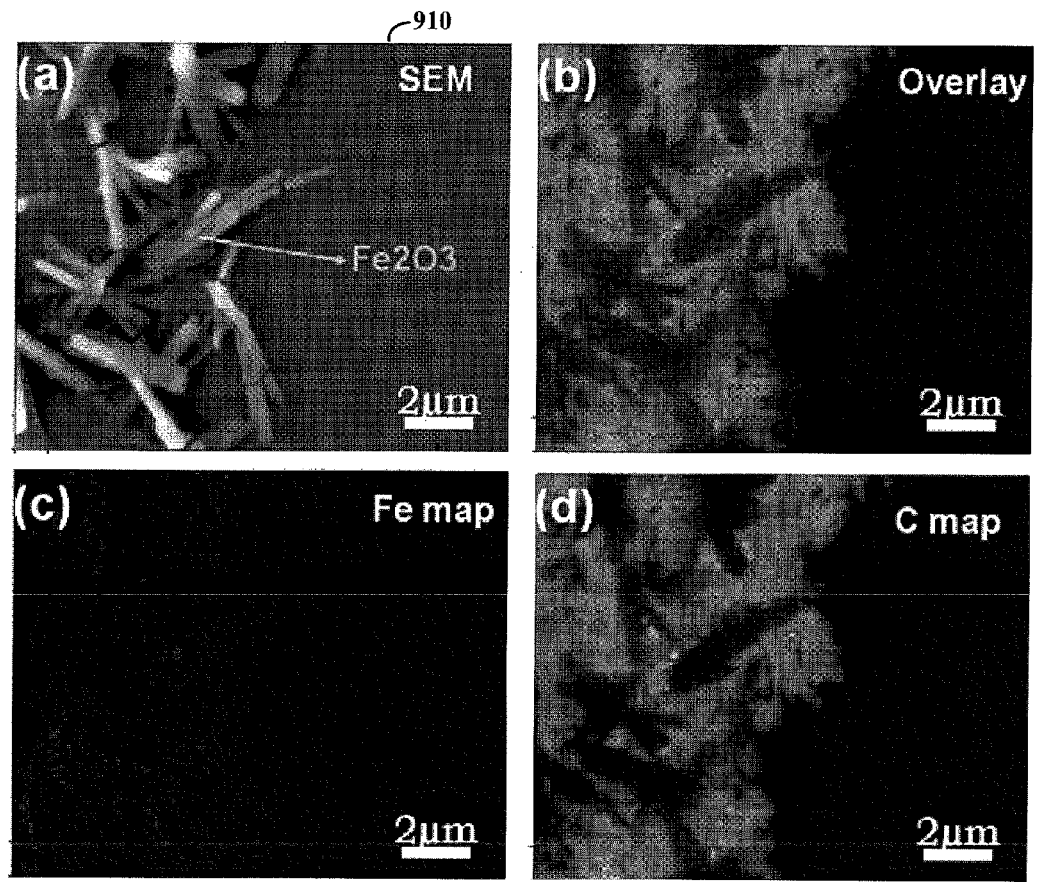

FIG. 9 shows a scanning auger electron spectroscopy characterization of a hydrothermally-derived $Fe_2O_3$/GS composite 910, consistent with a further embodiment of the present disclosure. FIG. 9a shows an SEM image of $Fe_2O_3$/GS, and FIGS. 9c-9d further depict auger mapping of the structure of FIG. 9a respectively for Fe (FIG. 9c) and C (FIG. 9d). FIG. 9b depicts an overlay of Fe and C as respectively shown in FIGS. 9c-9d.

Figure 10:
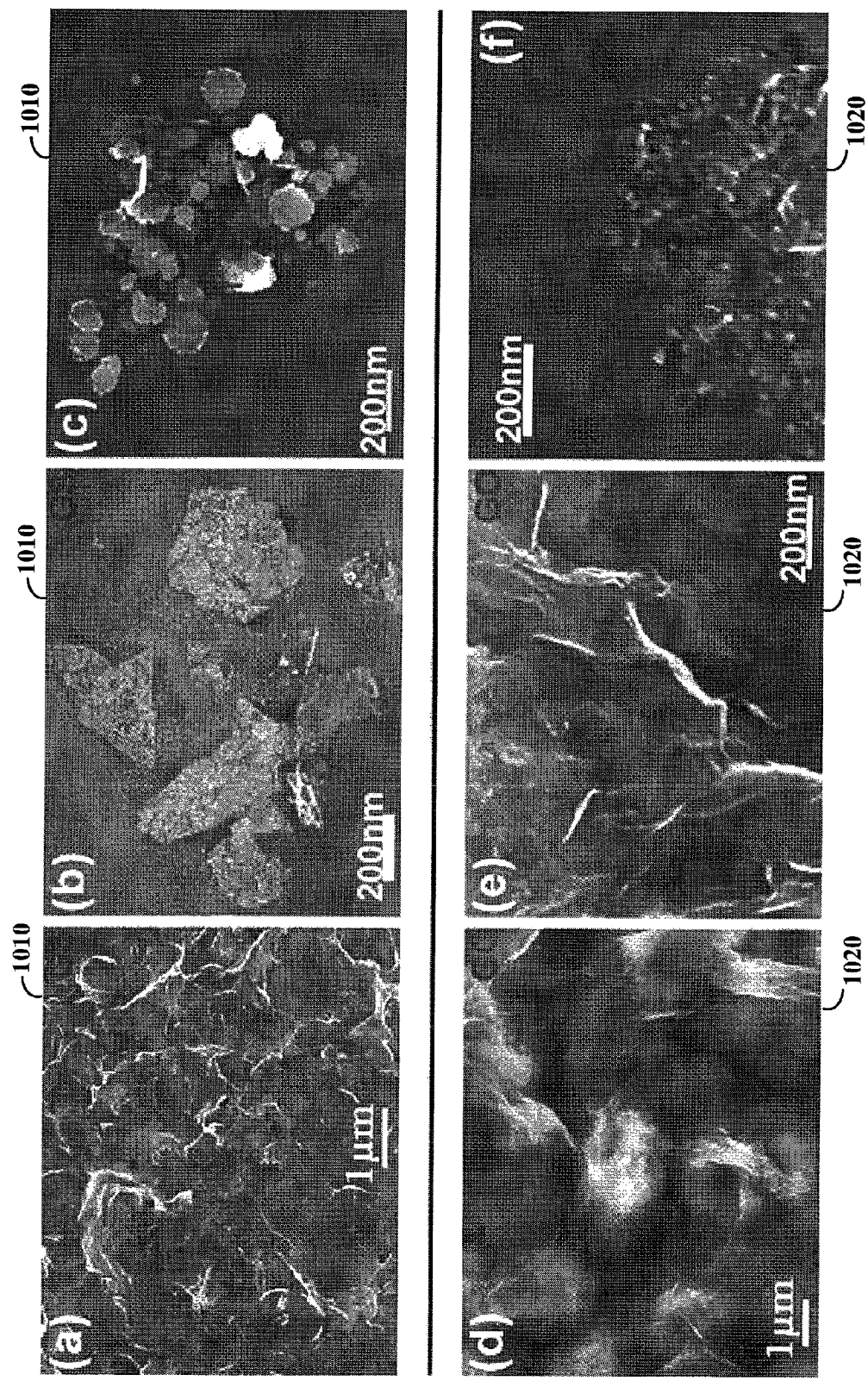

FIG. 10 shows SEM characterization of GS/Co(OH)$_2$ (1010) and GO/Co(OH)$_2$ (1020) composites, consistent with other embodiments of the present disclosure (XRD data not shown). FIGS. 10a-10b depict low and high magnification SEM images of as-made GS/Co(OH)$_2$ composite 1010 after a first step of reaction at 50° C., and FIG. 10c shows an SEM image of this composite after a second-step hydrothermal reaction at 80° C. FIGS. 10d-10e show low and high magnification images of as-made GO/Co(OH)$_2$ 1020 after the first step of reaction at 50° C., and FIG. 10f shows an SEM image of the aforementioned composite after the second-step hydrothermal reaction at 80° C. After the first step of reaction, both the GS and GO were uniformly coated with small nanoparticles, showing the same morphology. However, after the second-step hydrothermal transformation reaction as discussed above, the small particles on GS formed nanoplates with some of them showing hexagonal shapes, while the coating on GO remained as small particles with irregular shapes.

Figure 11:
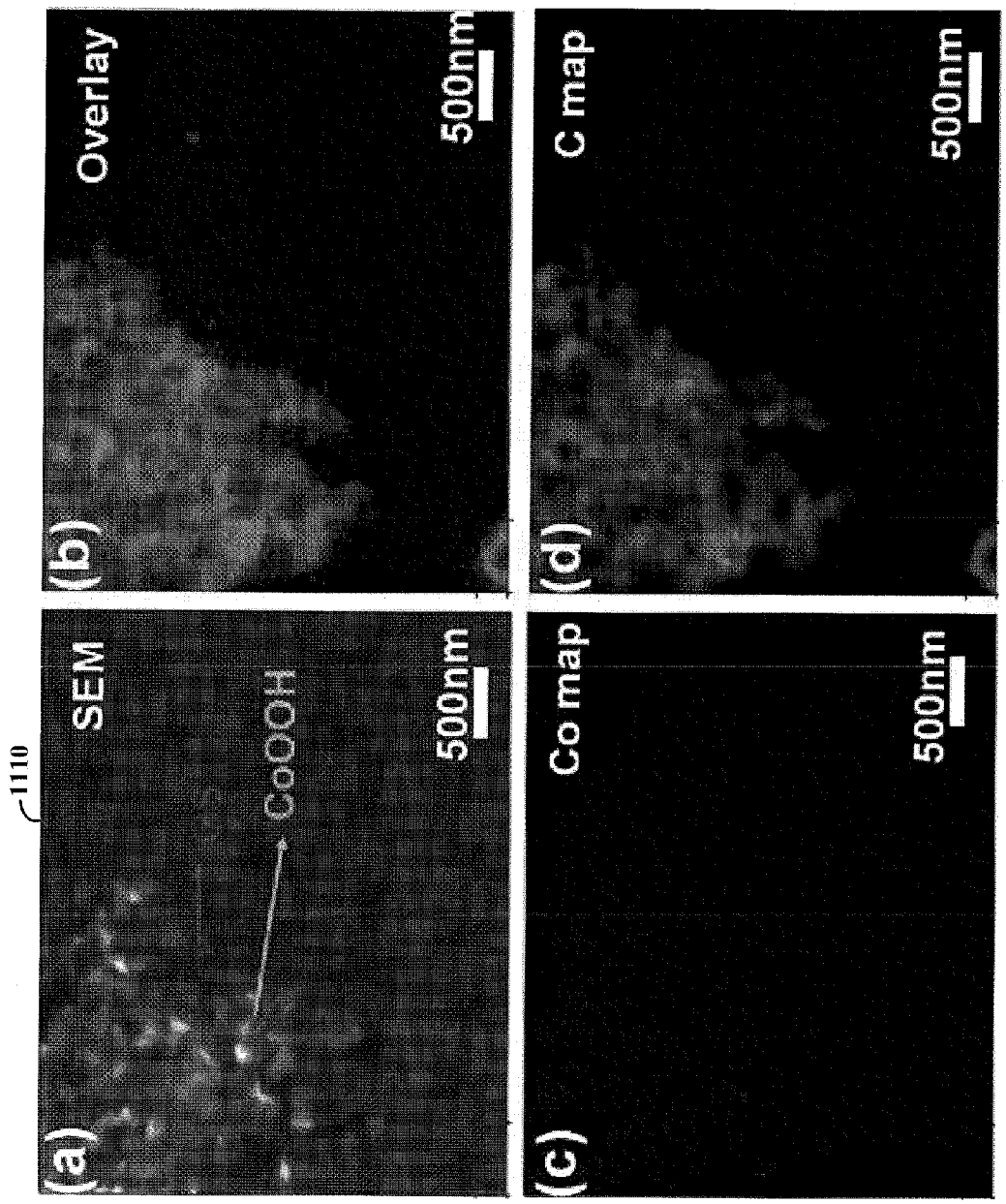

FIG. 11 shows a scanning auger electron spectroscopy characterization of a hydrothermally-derived CoO(OH)/GS composite, consistent with another embodiment of the present disclosure. FIG. 11a shows an SEM image of CoO(OH)/GS 1110. FIGS. 11c-11d further depict auger mapping of the structure of FIG. 11a respectively for Co (FIG. 11c) and C (FIG. 11d). FIG. 11b depicts an overlay of FIGS. 11c-11d.

Figure 12:
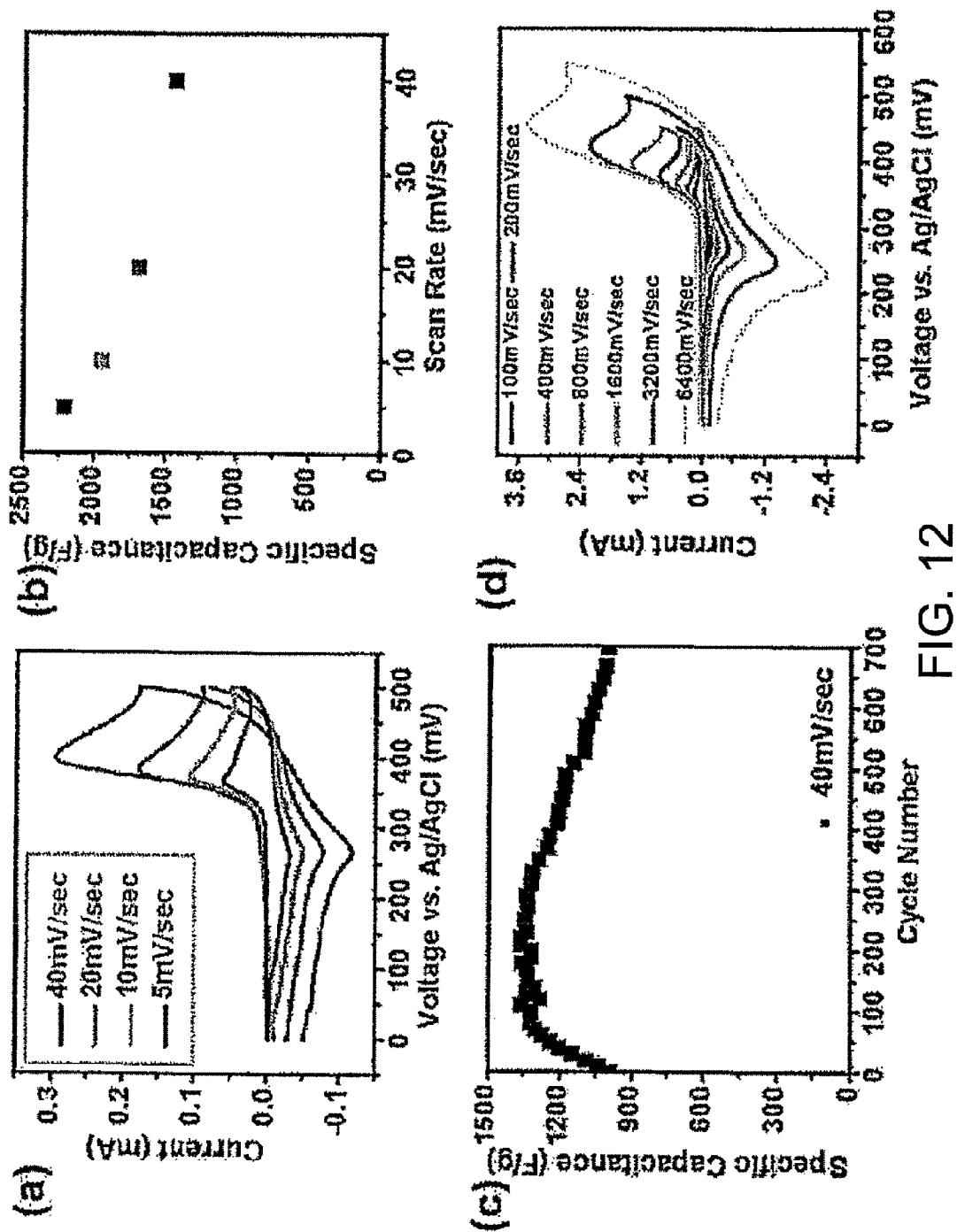

FIG. 12 depicts plots showing electrochemical characterization of Ni(OH)$_2$ nanoplates/GS composite with ~1:1 C/Ni(OH)$_2$ weight ratio, according to further embodiments of the present disclosure. Consistent with one or more detailed/experimental embodiments, the sample used in FIG. 12 has ~50% of GS by weight, and is achieved by increasing the concentration of GS during the synthesis. FIG. 12a shows CV curves of Ni(OH)$_2$ nanoplates/composite at various scan rates, whereas FIG. 12b shows the average specific capacitance of Ni(OH)2 nanoplates grown on GS at various scan rates. FIG. 12c graphs average specific capacitance calculated from CV curves versus cycle number of Ni(OH)$_2$ nanoplates grown on GS at a scan rate of 40 mV/sec. FIG. 12d further shows the CV curves of the Ni(OH)$_2$ nanoplates/composite at ultrafast scan rates up to 6.4V/s.

Figure 13:
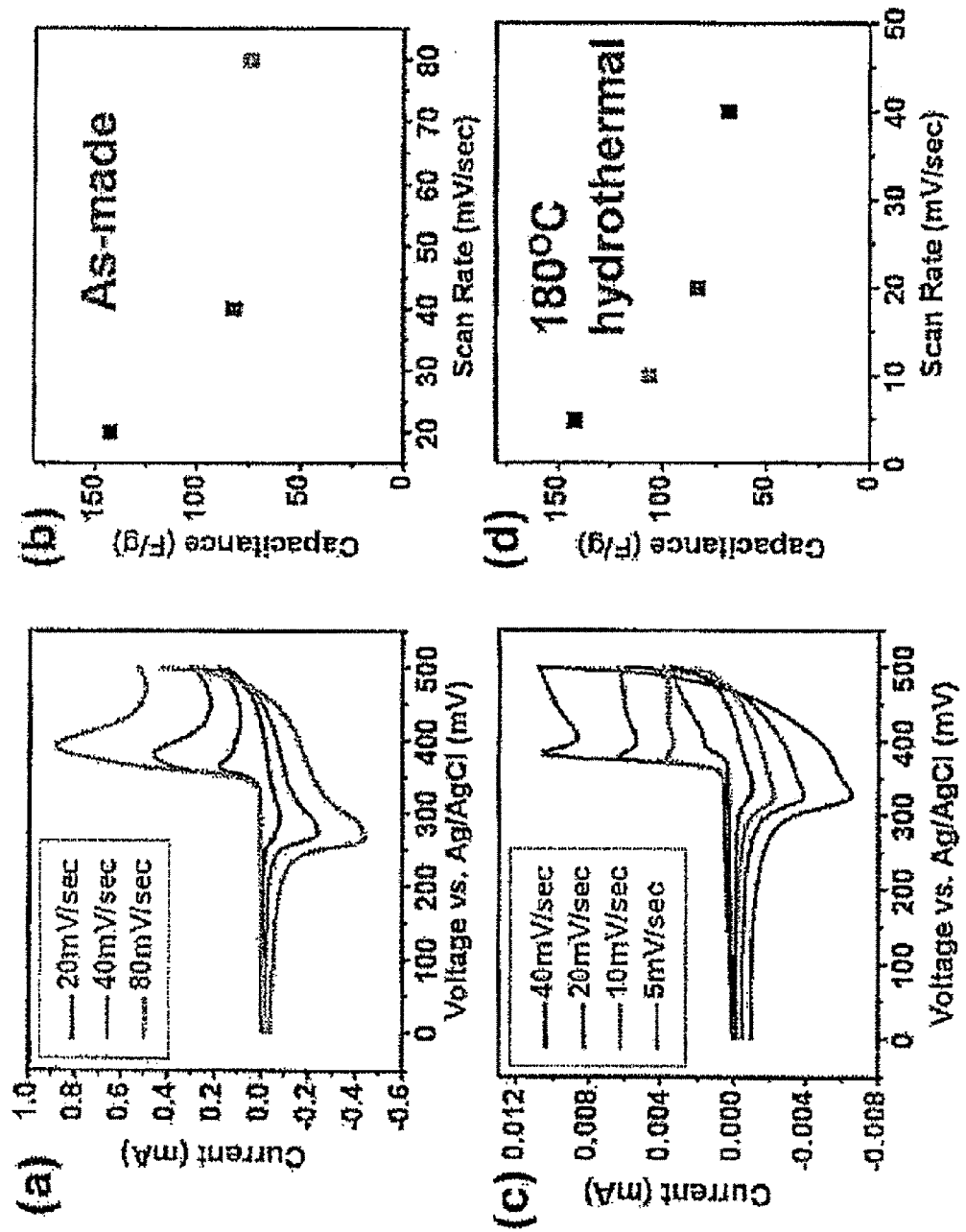

FIG. 13 depicts CV curves of hydrothermally-derived GO/Ni(OH)$_2$ composites at various scan rates, according to another embodiment of the present disclosure. FIG. 13a shows the first-step reaction, and FIG. 13c shows the second-step reaction of the hydrothermally-derived GO/Ni(OH)$_2$ composites. Average specific capacitance of as-made, and hydrothermally-derived GO/Ni(OH)$_2$ composites, are respectively shown in FIG. 13b and FIG. 13d. The average specific capacitance values of the GO/Ni(OH)$_2$ composites were more than 10 times lower than the GS/Ni(OH)$_2$ composites due to the insulating nature of GO (more than 100 times less conducting than GS).

Figure 14:
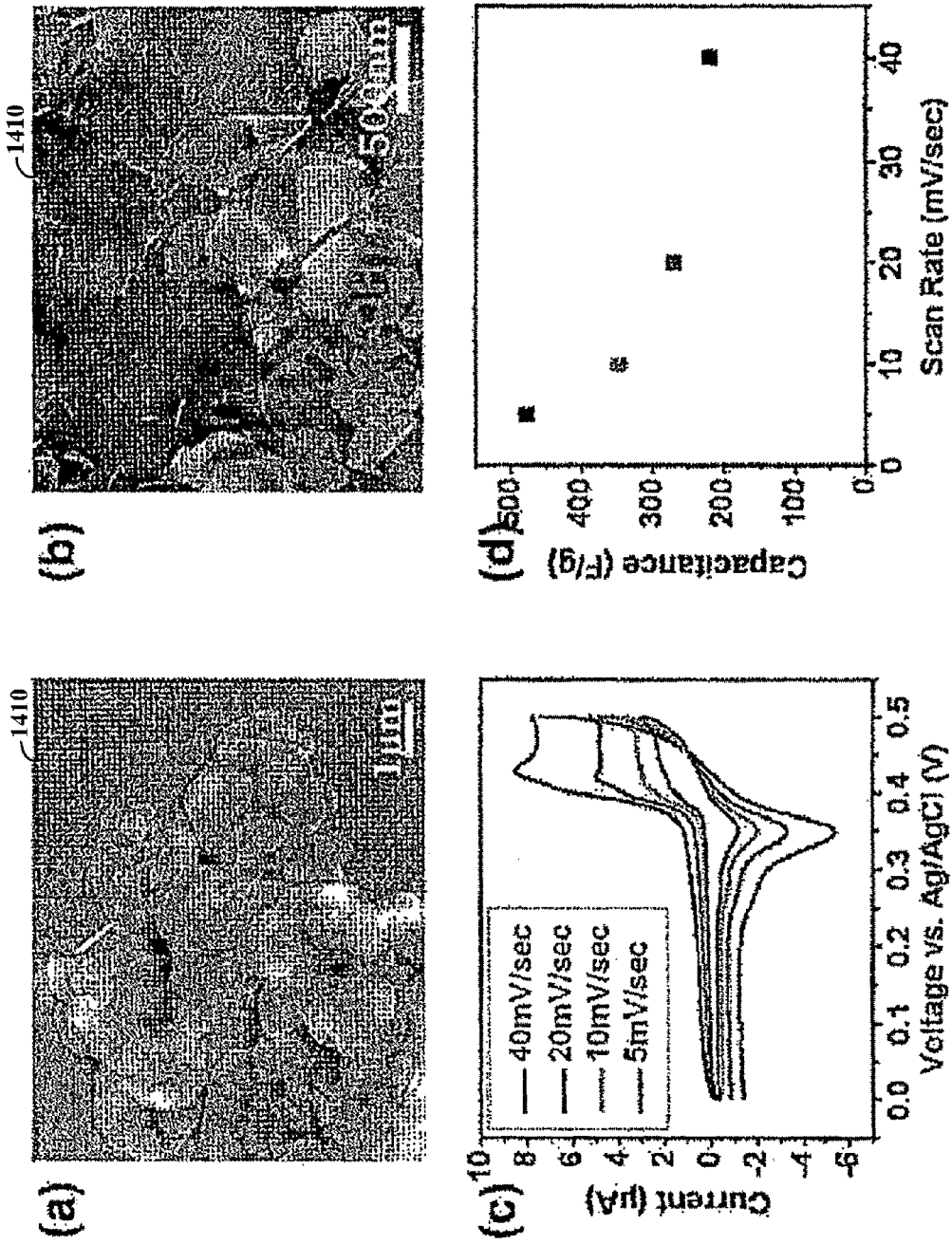

FIG. 14 shows SEM images and other graphs depicting a composite 1410 of Ni(OH)$_2$ nanoplates mixed with GS, according to other embodiments of the present disclosure. FIG. 14a shows an SEM image of hydrothermally derived Ni(OH)$_2$ nanoplates, and their simple mixture with GS (the same Ni/C ratio as GS/Ni(OH)$_2$) as shown in FIG. 14b. FIGS. 14c and 14d respectively show the CV curves and the average specific capacitance of the simple mixture at various scan rates. The Ni(OH)$_2$ nanoplates are made by hydrolysis of aqueous Ni(Ac)$_2$ solution at 180° C. hydrothermal conditions. The Ni(OH)$_2$ nanoplates are mixed with GS/DMF suspension by 3 min. of bath sonication. The mixture is transferred to water and deposited on substrates for SEM and CV characterization. In detailed/experimental embodiments consistent herewith, the average specific capacitance values were much lower than the GS/nickel composites due to the phase separation and poor contact between individual Ni(OH)$_2$ nanoplates and GS. In FIG. 14b, phase separation of the Ni(OH)$_2$ nanoplates and GS is shown.

Figure 15:
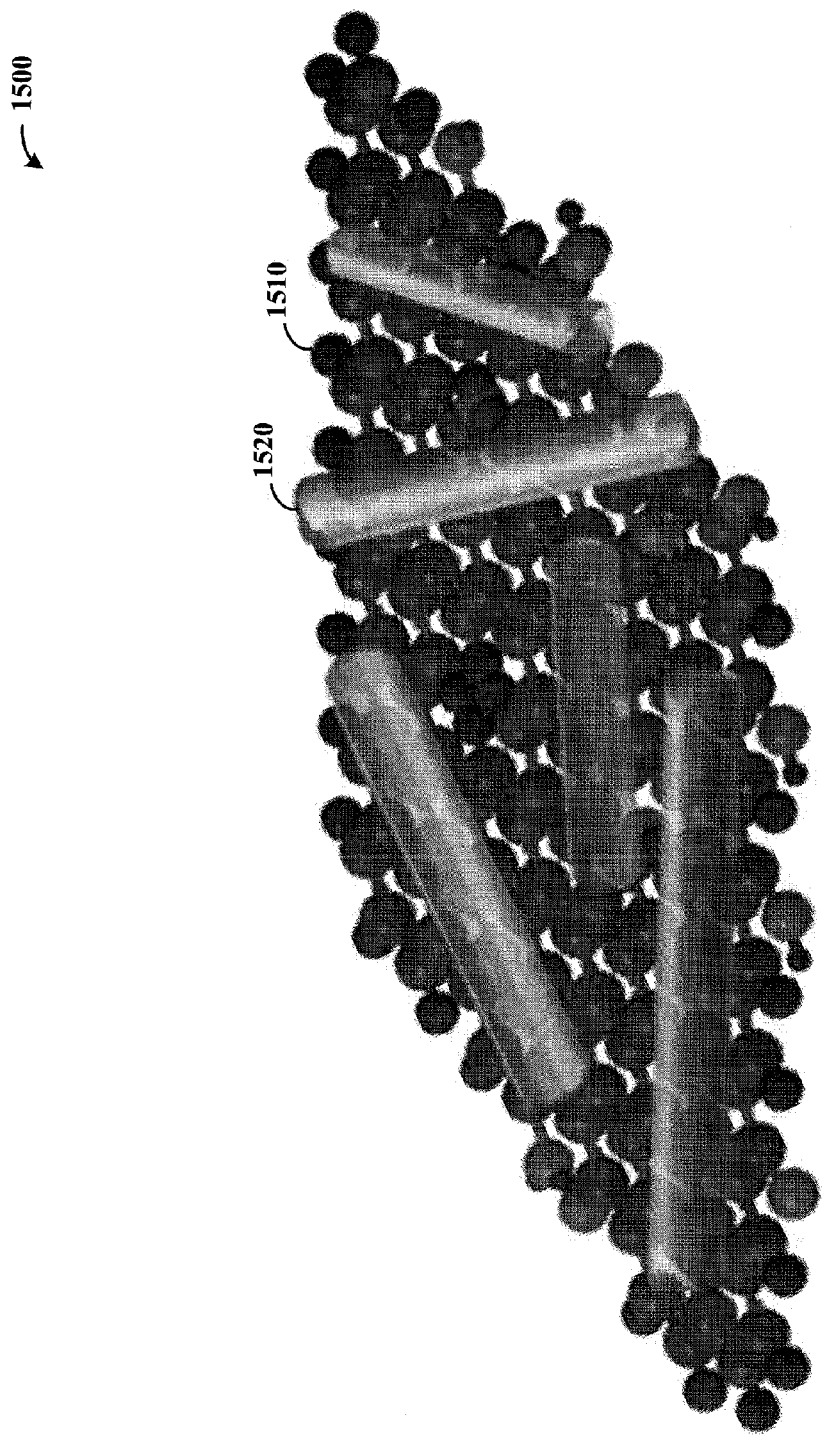
FIG. 15 shows a graphene-based electrode with nanorods grown thereupon, in accordance with one or more example embodiments.

FIG. 15 shows a graphene-based electrode 1500, in accordance with one or more example embodiments. The electrode 1500 includes a graphene-based sheet 1510 with nanorods, including nanorod 1520, thereupon. The nanorods can be used to facilitate interaction of the electrode in connection with various applications, such as those described herein with regard to supercapacitors and batteries.

Figure 16:
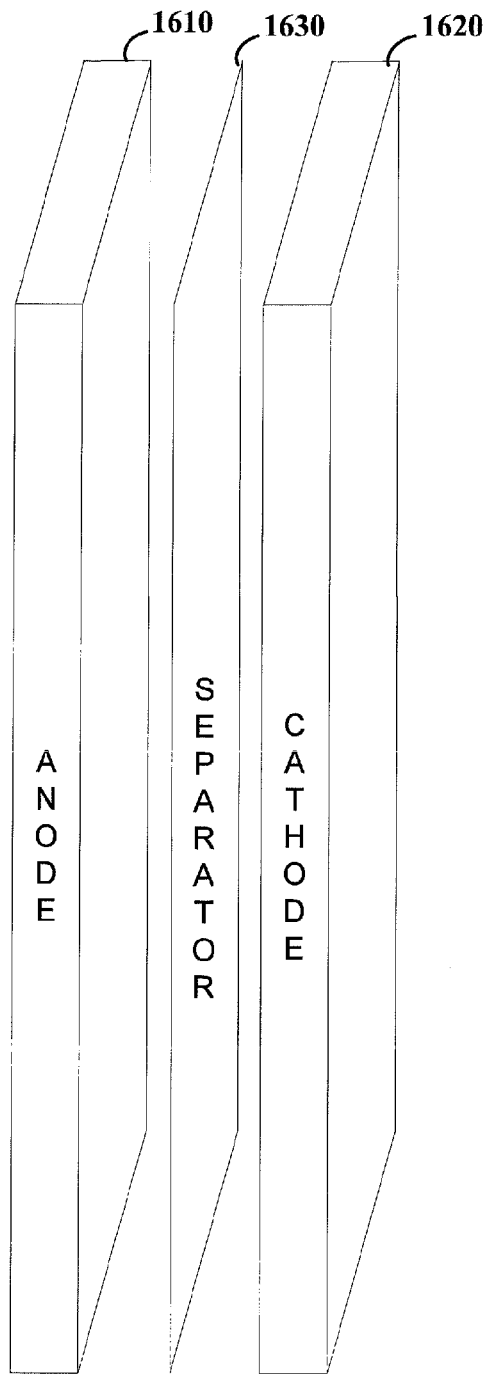
FIG. 16 shows a supercapacitor, in accordance with one or more example embodiments.

FIG. 16 shows a supercapacitor 1600, in accordance with one or more example embodiments (e.g., inorganic/GS hybrid). The supercapacitor 1600 includes an anode 1610 and cathode 1620 separated by a separator 1630. One or both of the anode and cathode 1610 and 1620 include a graphene sheet, with a single-crystalline material grown thereupon. For example, in one embodiment the anode 1610 includes a graphene sheet with Ni(OH)$_2$. In some embodiments, the cathode 1620 includes RuO$_2$ grown on a graphene sheet. Depending upon the application, the supercapacitor 1600 may be implemented as an asymmetric capacitor, or as an electric double-layer capacitor. In addition, while shown spaced for clarity, the anode 1620, cathode 1620 and separator 1630 can be stacked on one another.

Figure 17:
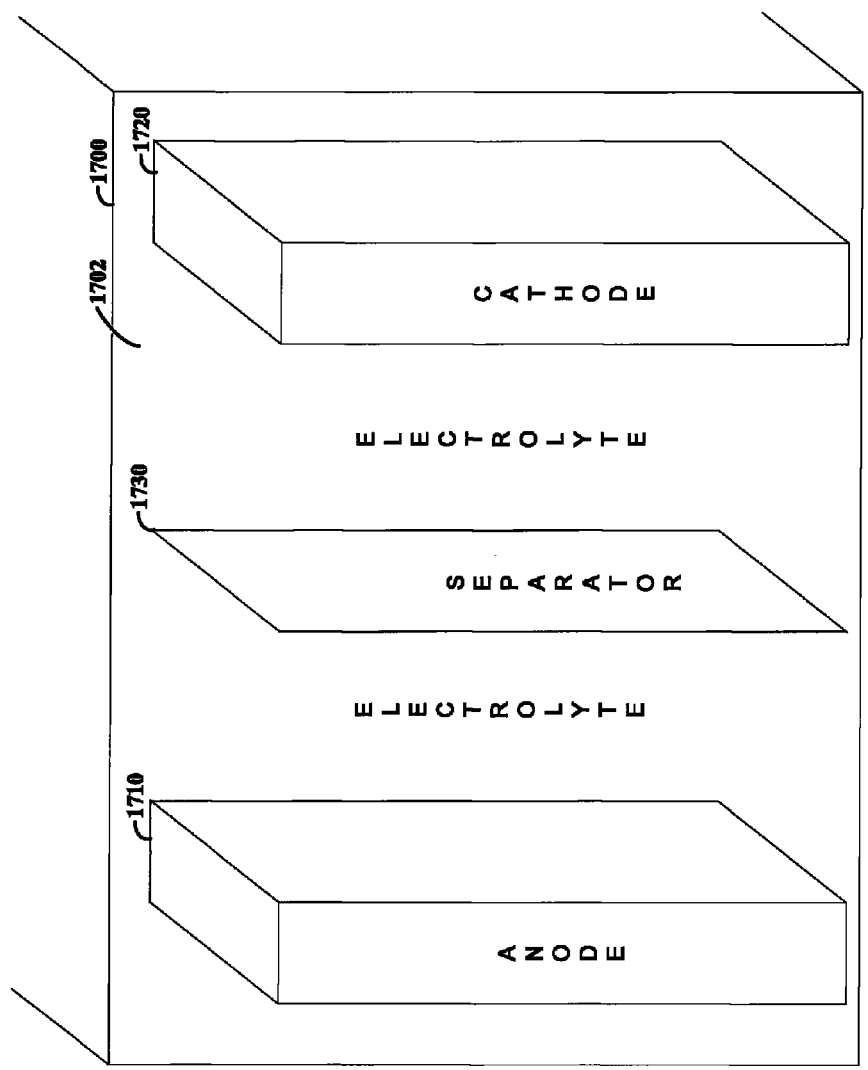
FIG. 17 shows a lithium-ion battery, in accordance with one or more example embodiments.

FIG. 17 shows a lithium-based battery 1700, in accordance with one or more example embodiments. The battery 1700 includes an anode 1710 and cathode 1720 with a separator 1730 therebetween. The battery 1700 also includes electrolyte material 1702 between the anode and cathode, with at least one of the anode and cathode being implemented with a graphene-based material. For instance, one embodiment is directed to implementation of the battery 1700 with the anode 1710 including a graphene sheet with Mn$_3$O$_4$ grown thereupon, as described herein. Other embodiments are directed to LiMn1-xFexPO4 Nanorods grown on graphene sheets as the cathode 1720 (e.g., with Lithium foil as the anode 1710). Still other embodiments are directed to lithium-sulfur batteries, with the cathode 1720 implemented with porous graphene-based sheets having sulfur impregnated in the pores, the sulfur-impregnated pores trapping polysulfides during charging/discharging.

Figure 18:
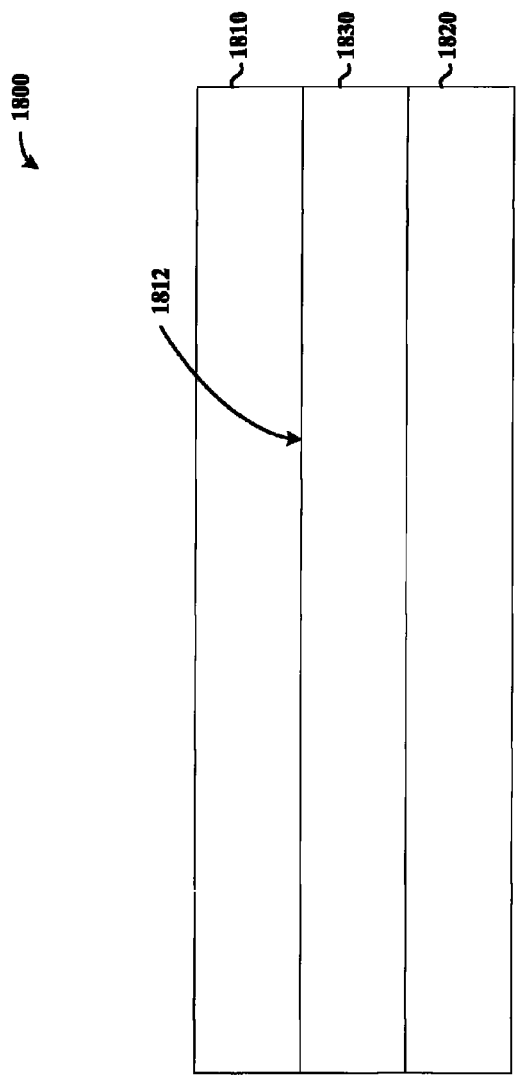
FIG. 18 shows a cross-sectional view of an air electrode, in accordance with one or more example embodiments.

FIG. 18 shows a cross-sectional view of an air electrode device 1800, in accordance with one or more example embodiments. The air electrode device 1800 includes a graphene-based electrode 1810 with inorganic nanocrystals grown at a surface (1812) thereof. A counter electrode 1820 is separated from the graphene-based electrode 1810 by an electrolyte material 1830. The hybrid material may include, for example, a catalyst structure that facilitates an interaction for charging and/or discharging. For instance, the air electrode device 1800 may be used in a battery or fuel cell, with the graphene-based electrode 1810 used as a cathode and interacting with air to generate charge carriers that are transported via the electrolyte 1830. In one such embodiment, Co$_3$O$_4$ is grown on a graphene sheet with the electrode 1810, and configured and arranged to catalyze at least one of an oxygen reduction reaction (ORR) and an oxygen evolution reaction (OER). Other embodiments are directed to materials such as Co$_{1-x}$S, Mn$_2$CO$_4$, an Fe/Mn$_2$CO$_4$ combination, Co$_2$MnO$_4$, and MnO$_x$ implemented with graphene as the electrode 1810.

Aspects of the disclosure are directed to nanocrystals on grapheme and carbon nanotubes used in connection with single-atom thick, two-dimensional conductors implemented to grow energy storage materials for high energy and power density devices. Examples of such energy storage materials and hybrid materials are discussed above, with examples of such energy/power density devices including supercapacitors and batteries.

Other aspects are directed to a two-step method for growing nanocrystals with well-defined nanoplate, nanorod or other morphologies on conducting graphene surfaces. The morphology of the nanocrystals formed on graphene is tailored by the degree of oxidation of graphene, the solvent, the precursors and the reaction temperature, and the method is applicable to synthesizing a wide range of functional nanomaterials.

In some embodiments, a graphene sheet (GS) with low degree of oxidation is made by an exfoliation-reintercalation-expansion method, and a graphene oxide sheet (GO) was produced by a modified Hummers method (FIG. 1). In certain detailed/experimental embodiments consistent herewith, the resistivity of GS was measured to be only several times higher than pristine graphene, but ~100 times lower than reduced GO. The oxygen content in GS (~5%) was much lower than in GO (~20%) as measured by Auger spectroscopy and X-ray photoelectron spectroscopy (XPS).

In various embodiments, the oxygen content is tuned, or set, between these levels to achieve a desirable foundation upon which to form nanocrystals such as nanorods and nanoplates or other related materials. In this context and in accordance with various example embodiments, a low-oxide graphene sheet refers to a sheet having an oxidation level that is below GO (~20%) as discussed above. In some embodiments, the sheet exhibits an oxidation level that is below about 10% oxidation, and in other embodiments, the sheet exhibits an oxidation level that is at or below ~5% oxidation. In connection with these and related detailed/experimental embodiments, it has been discovered that tuning the oxidation accordingly sets characteristics of the nanocrystals or other materials formed (e.g., grown) thereupon. Such tuning may, for example, be carried out by controlling one or more growth characteristics. The resulting structure, which may be referred to as a hybrid structure (e.g., via interaction between the graphene sheet and nanocrystal materials), exhibits characteristics that can be tailored for particular applications such as battery applications.

In the first step of $Ni(OH)_2$ growth on graphene, precursor materials are deposited in the form of small nanoparticles uniformly onto GS or GO by hydrolysis of $Ni(CH_3COO)_2$, at 80° C. in a 10:1 N,N-dimethylformamide (DMF)/water mixture. In connection with various detailed/experimental embodiments, it has been discovered that the 10:1 DMF/$H_2O$ ratio can be important to afford good dispersion of graphene and slow rate of hydrolysis that led to selective and uniform coating of nickel hydroxide on graphene, with little particle growth in free solution. After the first step, dense and uniform $Ni(OH)_2.0.75H_2O$ nanoparticles (~10-20 nm in diameter) are formed on both GS and GO, revealed by scanning electron microscopy (SEM) (FIG. 5) and X-ray diffraction (XRD) (FIG. 6a, 6c). The percentage of mass of $Ni(OH)_2.0.75H_2O$ was ~87% in the graphene composite. When water is used as the sole solvent, appreciable $Ni(OH)_2.0.75H_2O$ particle growth is achieved in free solution instead of on GS due to fast hydrolysis rate.

In the second step, the first step product, i.e., Ni(OH)$_2$.0.75H$_2$O coated GS is hydrothermally treated at 180° C. in water (see Methods Summary and Supplementary Information). It has been observed/discovered that the coating material evolved from dense small particles into hexagonal nanoplates selectively attached to GS (FIG. 1 top panel and FIG. 2). The side length of the nanoplates was several hundred nanometers with thickness <~10 nm (FIG. 2a-c,2e). XRD of a thick layer of packed nanoplates/GS suggested crystalline β-$Ni(OH)_2$ formed on graphene (FIG. 2f). Transmission electron microscopy (TEM) (FIG. 2c,2d) clearly revealed the (100) and (010) lattice fringes in the plane of single-crystalline hexagonal $Ni(OH)_2$ nanoplate on GS. The corresponding fast Fourier transform (FFT, FIG. 2d inset) of the high resolution TEM image was consistent with hexagonal lattice perpendicular to the (001) zone axis, suggesting $Ni(OH)_2$ nanoplates attached to GS at their (001) planes. In a film of the packed $Ni(OH)_2$/GS plates for XRD experiments and later electrochemical measurements, a large fraction of the plates were packed in parallel to each other and to the substrate, giving an enhanced (001) diffraction peak in the XRD spectrum (FIG. 2f). Scanning Auger electron spectroscopy (SAES) elemental imaging of Ni and C elements in $Ni(OH)_2$/GS composite further confirmed attachment of $Ni(OH)_2$ nanoplates on GS (FIG. 7).

The same $Ni(OH)_2.0.75H_2O$ coating obtained on GO led to small nanoparticles of β-$Ni(OH)_2$ after the second step of hydrothermal treatment at 180° C. (FIG. 1 lower panel, FIG. 3 and FIG. 6d), without producing large single-crystalline hexagonal nanoplates as in the GS case. In connection with these results, it has been discovered that the size, morphology and crystallinity of nanocrystals formed on graphene are dependent on the degrees of oxidation of the underlying graphene substrates. Accordingly, various embodiments are directed to setting one or more of the size, morphology and crystallinity of nanocrystals by controlling the degree of oxidation.

GS with fewer functional groups and defects exhibit weaker chemical interactions with coating species on the surface. During the 180° C. hydrothermal reaction, the small coating particles on GS diffused across the 'slippery' graphitic lattice and recrystallized into single crystalline hexagonal nanoplates on the GS. On GO, however, due to higher density of oxygen functional groups including carboxylic, hydroxyl, and epoxy groups, the GO surface interacted strongly with the coated species, providing pinning forces to the small particles to hinder diffusion and recrystallization. As a result, most of the $Ni(OH)_2.0.75H_2O$ particles coated on GO by the first step reaction remained pinned at the original positions after the second step hydrothermal treatment at higher temperature. In the case of $Ni(OH)_2$/GS, one or both of chemisorption and van der Waals interactions are used with respect to interactions between $Ni(OH)_2$ nanoplates and graphene, at oxygen-containing defect sites and pristine regions of the GS respectively.

The synthesis of beta-$Ni(OH)_2$ on GS can be readily applied for other nano-carbon substrates such as GO with various oxidation degrees and oxidized carbon nanotubes.

For general information regarding graphene sheets, and for specific information regarding various approaches to the fabrication of graphene sheets and/or other aspects that may relate to one or more example embodiments, reference may be made to Appendix A in the above-cited (and incorporated) patent document (Ser. No. 61/444,480) for these related teachings.

Various embodiments are directed to an approach for controlling nanocrystal morphology by two-step synthesis on graphene with different degrees of oxidation (FIGS. 8-11). CoO(OH) and $Fe_2O_3$ nanocrystals are produced with regular nanoplate or nanorod morphologies on OS, using $Co(CH_3COO)_2$, and $Fe(CH_3COO)_2$, as precursors (FIGS. 8c and 10c) respectively. On GO, small irregularly-shaped nanoparticles are formed (FIGS. 8f and 10f). These results exemplify the use of graphene with various degrees of oxidation to control/set the growth of nanocrystals with various sizes and morphologies.

Using these approaches, each Ni(OH)$_2$ nanoplate is formed in intimate contact with highly conducting GS, to facilitate fast electron transport between nanoplates and the attached graphene sheets for electrochemical applications. A thick film of Ni(OH)$_2$/GS can be formed on a platinum working electrode by packing the nanoplate/GS composites by simple drop-drying. The stacked Ni(OH)$_2$ nanoplates/GS building blocks are electrically interconnected through the GS attached to each Ni(OH)$_2$ nanoplate (FIG. 4a). Electrochemical performance composites/hybrid materials in accordance with various embodiments are characterized as follows (e.g., as tested with a three-electrode beaker cell with saturated Ag/AgCl as the reference electrode and 1M aqueous KOH solution as electrolyte). Cyclic voltammetry (CV) shows redox current peaks corresponding to the reversible reactions of Ni(II)↔Ni(III) (FIG. 4b), and the capacitance of the Ni(OH)$_2$ nanoplates on GS is shown/calculated for different scan rates (FIG. 4c). The highly crystalline hydrothermally derived hexagonal Ni(OH)$_2$ nanoplates on GS exhibit excellent characteristics for high performance redox electrochemical pseudo-capacitors. The average stable-specific capacitance can be up to and/or exceeding ~1230 F/g (based on weight of Ni(OH)$_2$~820 F/g based on total sample weight) after 200 cycles at a high scan rate of 40 mV/s (FIG. 4d), ~10 times higher than electrochemical double-layer super-capacitors based on graphene and carbon nanotubes. This is also a high stable capacitance for pseudo-capacitive nanomaterials including Ni(OH)$_2$, RuO$_2$ and MnO$_2$ with capacitances typically in the range of ~200-1000 F/g at slower scan rates (<10 mV/s, see Table 1 in the above-referenced patent application Ser. No. 13/401,655).

Constant-current galvanostatic charge/discharge experiments reveal that even at an ultra-high discharge current density of ~50 A/g, material in accordance with one or more embodiments described herein, can be used to achieve a high capacitance of ~1000 F/g (FIG. 4e, 4f). Hexagonal Ni(OH)$_2$ nanoplates grown on GS showed higher specific capacitance at higher charge/discharge rates than pseudo-capacitive nanomaterials of Ni(OH)$_2$, MnO$_2$, RuO$_2$ and their composites with carbon nanotubes or nanofibers (see, Table 1 above). In some embodiments, single-crystalline Ni(OH)$_2$ hexagonal nanoplates on GS are used as building blocks for high capacity and ultrafast energy storage and releasing, with highly insulating Ni(OH)$_2$ nanoplates directly grown and anchored on highly conducting graphene sheets. This affords facile electron transport between individual nanoplates and the GS, which can be used to achieve both high specific capacitance and excellent rate capability of the Ni(OH)$_2$/GS material. With little dead volume, all Ni(OH)$_2$ nanoplates in the macroscopic ensemble are electrochemically active and conduct to the outside through the attached GS in an interconnected graphene network. Rapid charge transport through the sample supports fast redox reactions at high scan rates and charge/discharge currents. Graphene sheets with low oxidation can be used to impart excellent electrical conductivity to composites with insulating nanomaterials.

In control test-type embodiments, Ni(OH)$_2$ nanoplates (FIG. 14a) are synthesized and mixed with GS. The simple physical mixture exhibited low capacitance (FIG. 14c, 14d) due to poor contact between the Ni(OH)$_2$ nanoplates and GS. Phase separation (FIG. 14b) was in fact observed between the Ni(OH)$_2$ nanoplates and GS in the mixture. Various nanoplates/GS approaches can be used as an alternative to physically mixing nano- or micro-particles with carbon nanotubes, using the two-dimensional nature of graphene affording optimal planar-contact with electrochemically active nanomaterials instead of line-contact in the nanotube case. Moreover, the morphology of large thin (<10 nm) single-crystalline nanoplates of Ni(OH)$_2$ on GS as formed in accordance with one or more embodiments can be used to achieve effective charging and discharging through the nanoplate thickness during fast cycling.

Various embodiments are directed to a multi-step (e.g., two-step) method as discussed herein, to grow nanocrystals with controlled sizes and morphologies on conducting graphene surfaces. The morphology of the nanocrystals formed on graphene can be tailored by the oxidation degree of graphene as well as other synthetic parameters, which can be extended to synthesize a wide range of nanomaterials for various applications, such as battery applications, supercapacitor applications and other circuit-based applications. The light weight, high surface area and high electrical conductivity of graphene facilitate its use as a substrate for materials growth for a wide range of high performance applications including electrocatalysis and energy storage and conversion. In some embodiments, we perform oxidation of carbon nanotubes (CNTs) using modified Hummer's methods to obtain chemically functionalized CNTs. In particular, few-walled and multi-walled CNTs were used for such oxidation, and the idea was to introduce oxygen functional groups on the outerwalls of CNTs similar to those on GO, while utilizing the high electrical conductivity of the inner walls of CNTs that remain largely intact through the oxidation process. The oxidized CNTs were found more advantageous over GO in making SC-hybrids in some cases.

In a method-based embodiment, a Ni(OH)$_2$/GS (GO) composite is synthesized, with 4 ml of GS (GO)/DMF suspension with a concentration of ~0.25 mg/ml graphene heated to 80° C., to which 0.4 ml of Ni(Ac)$_2$ aqueous solution with a concentration of 0.2M is added. The suspension is kept at 80° C. with stirring for 1 hour. For a second step reaction, the intermediate product is transferred to 10 ml of water and sealed in Teflon® lined stainless steel autoclaves for hydrothermal reaction at 180° C. for 10 hours. The composites are characterized by SEM (Raith 150), TEM (FEI Tecnai F20), XRD (PANalytical X'Pert), and SAES (PHI 700). For electrochemical measurement, the composites can be drop-dried onto nickel foam from water suspension. CV and galvanostatic charge/discharge can be carried out on a CHI 660D electrochemistry station.

Various other example embodiments are directed to Fe-doped LiMnPO$_4$ (e.g., LiMn$_{0.75}$Fe$_{0.25}$PO$_4$) nanorods bonded on graphene sheets, to render nanorods with desirable/superior electrical conductivity. The nanorod morphology corresponds to materials grown on graphene relative to those grown in free solution, and facilitates fast lithium ion diffusion with the diffusion path of [010] crystallographic axis along the short radial direction (~20-30 nm) of the nanorods. In various embodiments, these structures are configured for ultrafast discharge within ~30-40 seconds without necessarily using high carbon content. The graphene sheets can be reduced from graphene and/or formed to a set degree of oxidation (e.g., as described in one or more of the Appendices in the above-referenced provisional patent applications), to achieve desired nanorod formation.

In accordance with one or more embodiments, a two-step approach is used to synthesize nanorods on reduced graphene oxide sheets that are stably suspended in solution. Fe-doped Mn$_3$O$_4$ nanoparticles are selectively grown onto graphene oxide by controlled hydrolysis. The oxide nanoparticle precursors are solvothermally reacted with lithium and phosphate ions, and transformed into $LiMn_xFe_{1-x}PO_4$ on the surface of reduced graphene oxide sheets. With a total content of 26 wt % conductive carbon, the resulting hybrid of nanorods and graphene exhibits high specific capacity and high power rate for cathode materials. Stable capacities of 132 mAh/g and 107 mAh/g can be obtained at high discharge rates of 20 C and 50 C, 85% and 70% of the capacity at C/2 (155 mAh/g) respectively. Some implementations are directed to using the electrode formed by the nanorod/graphene hybrid for lithium-ion batteries with high energy and high power densities. Some implementations are directed to the synthesis of $LiMn_{0.75}Fe_{0.25}PO_4$ nanorods, with a crystal shape and morphology for fast lithium ion diffusion along the radial [010] direction of the nanorods.

In one such two-step approach in which a solution phase reaction scheme for synthesizing $LiMn_{0.75}Fe_{0.25}PO_4$ nanorods on reduced graphene oxide is implemented, oxide nanoparticles are grown at 80° C. on mildly oxidized graphene oxide (mGO) stably suspended in a solution. The hydrolysis rate of $Mn(Ac)_2$ and $Fe(NO_3)_3$ is controlled by adjusting the H2O/N,N-dimethylformamide (DMF) solvent ratio and the reaction temperature afforded selective and uniform coating of ~10 nm nanoparticles of Fe-doped $Mn_3O_4$ on GO sheets without free growth of nanoparticles in solution. The mGO can be made by a modified Hummers method, with which a six times lower concentration of $KMnO_4$ oxidizer was used to afford milder oxidation of graphite.

A second step reaction transforms the Fe-doped $Mn_3O_4$ nanoparticles into $LiMn_{0.75}Fe_{0.25}PO_4$ nanorods, by reacting with LiOH and $H_3PO_4$ solvothermally at 180° C. Ascorbic acid (VC) is added to reduce Fe(III) to Fe(II), and reduce mGO as well. This afforded highly-conducting reduced graphene oxide sheets (rmGO) with the formation of $LiMn_{0.75}Fe_{0.25}PO_4$ nanorods atop. The electrical conductivity measured from pellets of $LiMn_{0.75}Fe_{0.25}PO_4$/rmGO hybrid can be achieved at about 0.1-1 S/cm, $10^{13}$-$10^{14}$ times higher than pure $LiMnPO_4$.

Various embodiments are directed to the formation of a hybrid battery material, using approaches such as discussed herein, to form a $LiMn_{0.75}Fe_{0.25}PO_4$ nanorod/rmGO hybrid material exhibiting intimate interaction between the nanorods and the underlying reduced graphene oxide sheets. The nanorod morphology and crystallographic orientation of the $LiMn_{0.75}Fe_{0.25}PO_4$ nanocrystals are set to facilitate the diffusion of lithium (or other) ions and related charge transport for rapid charging and discharging for the battery.

Other example embodiments are directed to an electrode having a graphene sheet and a plurality of nanorods including Fe-based material on the graphene sheet. In some implementations, the electrode is a battery cathode, the Fe-based material includes Fe-doped $LiMnPO_4$ bonded on the graphene sheet, and the graphene sheet and nanorods form a hybrid battery material configured for charging and discharging via the addition and discharge of lithium ions.

The nanorods can be formed in a variety of manners and arrangements. In some implementations, the nanorods are formed in a diffusion path in a [010] crystallographic axis in a radial direction of the nanorods. Such (e.g., single crystal) nanorods may also have a length that extends along a [001] crystallographic axis, and may have a length of between about 50 and 100 nanometers and a diameter of between about 20-30 nanometers. In some implementations, the nanorods are configured and arranged with an underlying graphene sheet to store and release energy via rapid lithium ion insertion and extraction along the diffusion path. Such nanorods may have an Mn/Fe ratio of about 3.

The graphene sheet can be implemented with the nanorods in a variety of manners. In some embodiments, the graphene sheet includes sufficient functional groups to nucleate and anchor oxide nanoparticles on the surface of the graphene sheet. In another embodiment, the graphene sheet includes at least one of carboxyl, hydroxyl and epoxide functional groups configured to nucleate and anchor oxide nanoparticles on the surface of the graphene sheet.

In one example embodiment, Fe-based material (e.g., Fe-doped $Mn_3O_4$) precursor nanoparticles are formed on a graphene sheet, and the nanoparticles are reacted with lithium and phosphate ions to form nanorods on the surface of the graphene sheet. The nanorods can be formed on the surface of the graphene sheet to interact with the sheet and form a hybrid material of a battery cathode. In some implementations, the precursor nanoparticles are Fe-doped $Mn_3O_4$ nanoparticles selectively grown on a graphene sheet, via controlled hydrolysis. In certain implementations, the nanorod/graphene sheet combination is annealed to form a hybrid nanorod-graphene material.

In some embodiments, the precursor nanoparticles are formed using a solution including $Mn(Ac)_2$ and $Fe(NO_3)_3$ by hydrolyzing the solution to selectively grow Fe-doped $Mn_3O_4$ nanoparticles on the graphene sheet. Reacting the nanoparticles with lithium and phosphate ions may include, for example, solvothermally reacting the nanoparticles with lithium and phosphate ions.

Where hydrolysis is implemented, the temperature and solvent concentration are set to facilitate the forming of the precursor nanoparticles to mitigate substantially all formation of the nanoparticles in solution with the solvent and promote the formation of the nanoparticles on the graphene sheet.

In a more particular embodiment, functional groups are formed on the graphene sheet, and which promote the adsorption of cations and nucleation of the nanoparticles. The nanoparticles are reacted with lithium and phosphate ions by forming $LiMn_xFe_{1-x}PO_4$ nanorods using aromatic regions of the sheet to promote the formation of nanocrystals.

Various experimental embodiments of the present disclosure are also directed toward a synthetic method of directly growing nanocrystals on oxidized nano-carbon. In certain embodiments, synthetic methods of directly growing nanocrystals on oxidized nano-carbon, consistent with various aspects of the present disclosure, include physically mixing active materials with conductive carbon (such as carbon black). The coupling between the nano-sized active materials and nanocarbon in the hybrid structures can drastically enhance charge transfer in the electrodes, which is capable of boosting the electrochemical property of the active materials. In certain embodiments, β-$Ni(OH)_2$/CNT is synthesized by growing β-phase nickel hydroxide onto oxidized multi-walled carbon nanotube (MWCNT). The functional groups on the oxidized outer walls of MWCNT interact with $Ni^{2+}$ in solution to initiate nucleation and growth of $Ni(OH)_2$, while the inner walls remained intact to provide conductive network for wiring $Ni(OH)_2$. The resulting β-$Ni(OH)_2$/CNT contains β-$Ni(OH)_2$ nanoplates with irregular shapes attached to MWCNTs.

Figure 24:
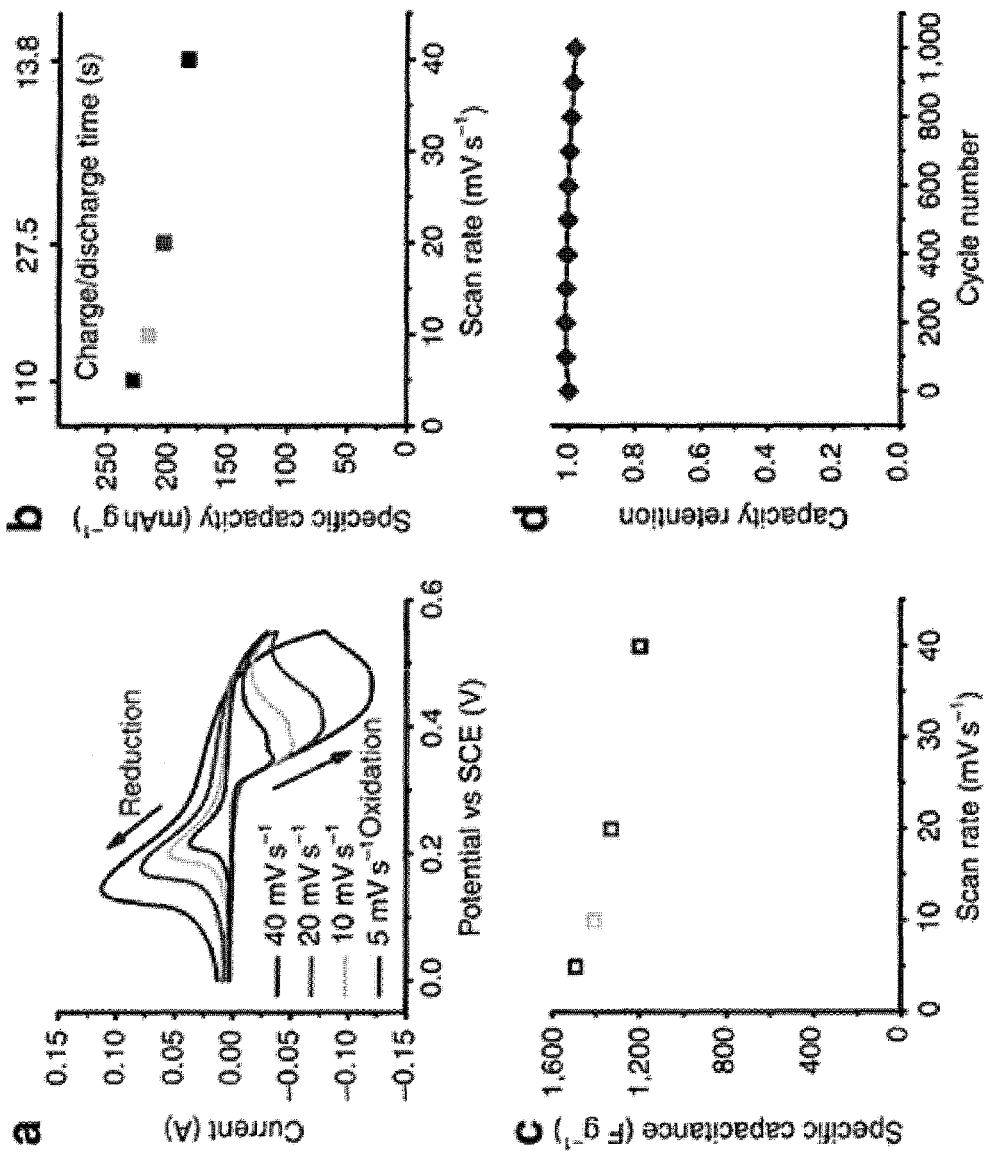
FIGS. 24a-24d show example electrochemical performance of β-Ni(OH)$_2$/MWNT in a three-electrode configuration in 1 M KOH, consistent with various experimental aspects of the present disclosure.

FIG. 24a-24d show example electrochemical performance of β-$Ni(OH)_2$/MWNT in a three-electrode configuration in 1 M KOH, consistent with various experimental aspects of the present disclosure. As shown in FIG. 24a, β-$Ni(OH)_2$/ MWNT includes a pair of Ni redox peaks in a voltage range of 0 V-0.55 V vs SCE. FIG. 24b illustrates an average specific capacity of $Ni(OH)_2$ nanoplates grown on oxidized MWNTs at various scan rates based on CV data in FIG. 24a. From these cyclic voltammetry (CV) curves, capacities of 228 mAh/g and 183 mAh/g (based on the active materials) are derived at scan rates of 5 mV/s and 40 mV/s respectively for the β-Ni(OH)$_2$/CNT hybrid materials. FIG. 24c shows average specific capacitance within a voltage range of 0.55 V (from 0 V to 0.55 V vs SCE) of Ni(OH)$_2$ nanoplates grown on oxidized MWNTs at various scan rates based on CV data in FIG. 24a. Additionally, β-Ni(OH)$_2$/CNT exhibited high cycling stability over 1000 CV cycles at 100 mV/s. FIG. 24d shows the cycling stability of the Ni(OH)$_2$/MWNT hybrid electrode over 1,000 CV cycles at 100 mV s$^{-1}$.

Experimental aspects of the present disclosure are also directed toward an alternative structure form of nickel hydroxide which is α-Ni(OH)$_2$, with Ni(OH)$_2$ layers having intercalated anions in between. In certain embodiments, α-Ni(OH)$_2$ has higher theoretical specific capacity than β-Ni(OH)$_2$. In certain embodiments, α-Ni(OH)$_2$ can be unstable in an alkaline solution. Aspects of the present disclosure are directed toward producing α-phase Ni(OH)$_2$ with higher specific capacity and overcoming the possible instability of the α-phase (in an alkaline solution) by, for instance, synthesizing Al and Co co-doped α-phase Ni(OH)$_2$ nanoplates on top of oxidized few-walled carbon nanotubes (NiAlCo/CNT). In such embodiments, the resulting NiAlCo/CNT hybrid material contained small oval-shaped thin nanoplates (~15 nm in width and ~2 nm in thickness) interconnected with CNTs. The nanoplates possess a layered double hydroxide (LDH, same structure as α-Ni(OH)$_2$) with a large interlayer spacing of 0.71 nm.

Figure 25:
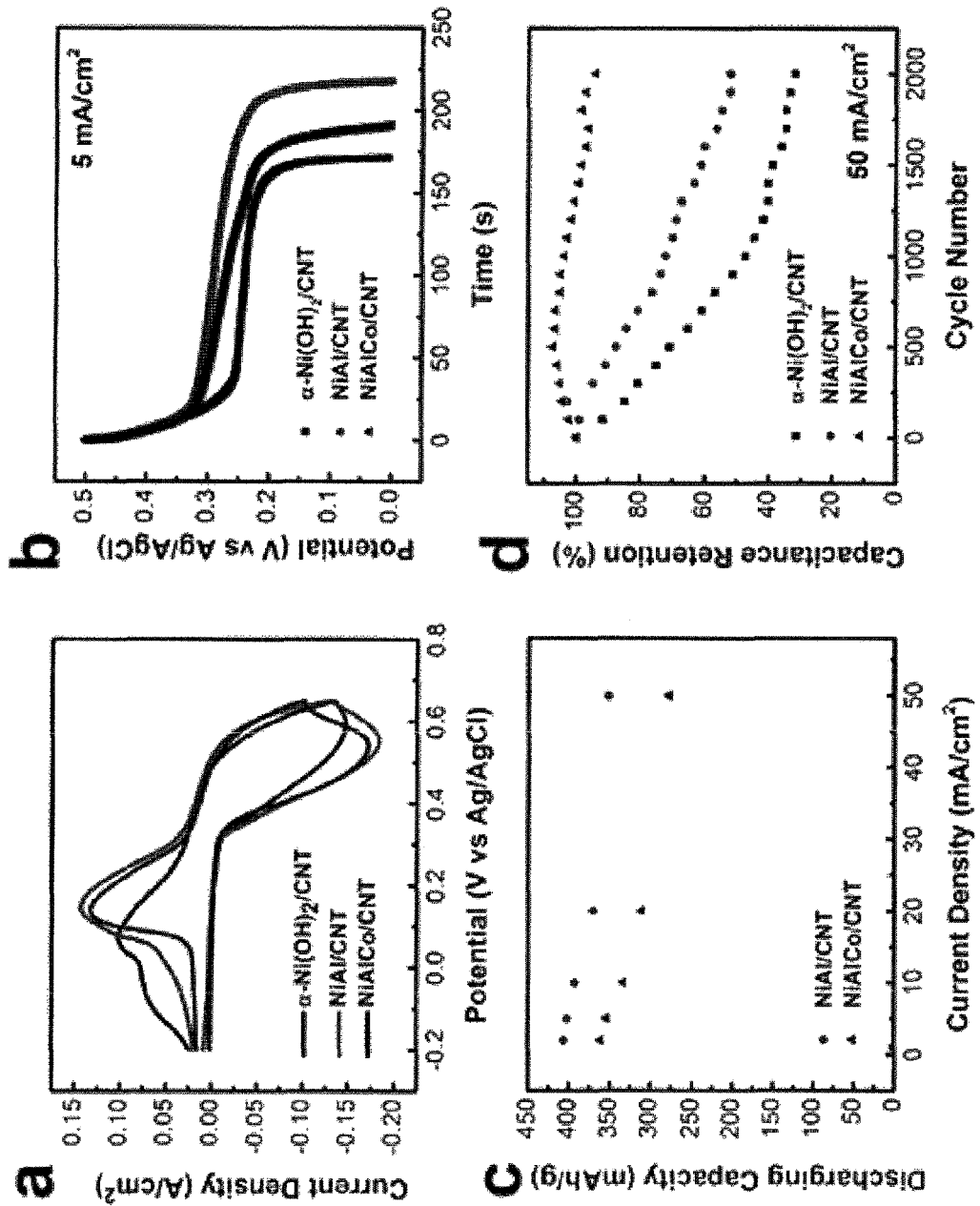
FIGS. 25a-25d show example electrochemical performance of the hybrid materials (NiAlCo/CNT, α-Ni(OH)$_2$/CNT and NiAl/CNT in 1 M KOH, consistent with various experimental aspects of the present disclosure.

FIG. 25a-25d show example electrochemical performance of the hybrid materials (NiAlCo/CNT, α-Ni(OH)$_2$/CNT and NiAl/CNT in 1 M KOH), consistent with various experimental aspects of the present disclosure. These measurements were taken in a three-electrode cell in 1 M KOH by cyclic voltammetry and chronopotentiometry. FIG. 25a shows example CV curves of the hybrid materials at various scan rates, and FIG. 25b shows galvanostatic discharge curves of the hybrid materials s at current density of 5 mA/cm$^2$ under same loading of 1 mg/cm$^2$. Additionally, in certain embodiments of the hybrid materials, the doping effects by Al and Co surprisingly improve the capacity and stability. Further, in other embodiments, Co doping greatly increases the stability. These results show that NiAlCo/CNT hybrid material is useful as a cathode material with high capacity and reasonable stability. For example, the NiAlCo/CNT hybrid material, in certain embodiments, showed a capacity of ~353 mAh/g and ~285 mAh/g at the discharge current density of 5 mA/cm$^2$ and 50 mA/cm$^2$ respectively (based on the mass of active materials, not including ~25 wt. % CNT mass), as illustrated in FIG. 25c, and an overall decay of ~6% over 2000 cycles under 50 mA/cm$^2$, as illustrated in FIG. 25d.

Various experimental aspects of the present disclosure are also directed toward zinc foil (with Zn(Ac)$_2$ in electrolyte) used as anode material for NiZn battery by electrodeposited zinc on Cu foam or Cu foil (with Zn(Ac)$_2$ in electrolyte). Surprisingly, electrodeposited zinc allows for the use of Zn foil (which can account for too large mass in active materials, leading to a drop in overall energy density and power density) as an anode material. In certain experimental embodiments, the electrodeposited zinc delivers similar capacity as Zn foil. In other embodiments, the electrodeposited zinc delivers similar capacity as Zn foil has lower stability.

Various other experimental aspects of the present disclosure are directed toward a NiZn battery with high energy density and power density. In certain embodiments, NiAlCo/CNT is paired with electrodeposited zinc on Cu foam in 1 M KOH with 0.05 M Zn(Ac)$_2$. In other embodiments, a ~1.00 mg/cm$^2$ loading of NiAlCo/CNT is paired with ~1.30 mg/cm$^2$ Zn (~0.65 mg pre-deposited Zn prior to charging and ~0.65 mg stoichiometrically deposited zinc during the first charging).

Figure 26:
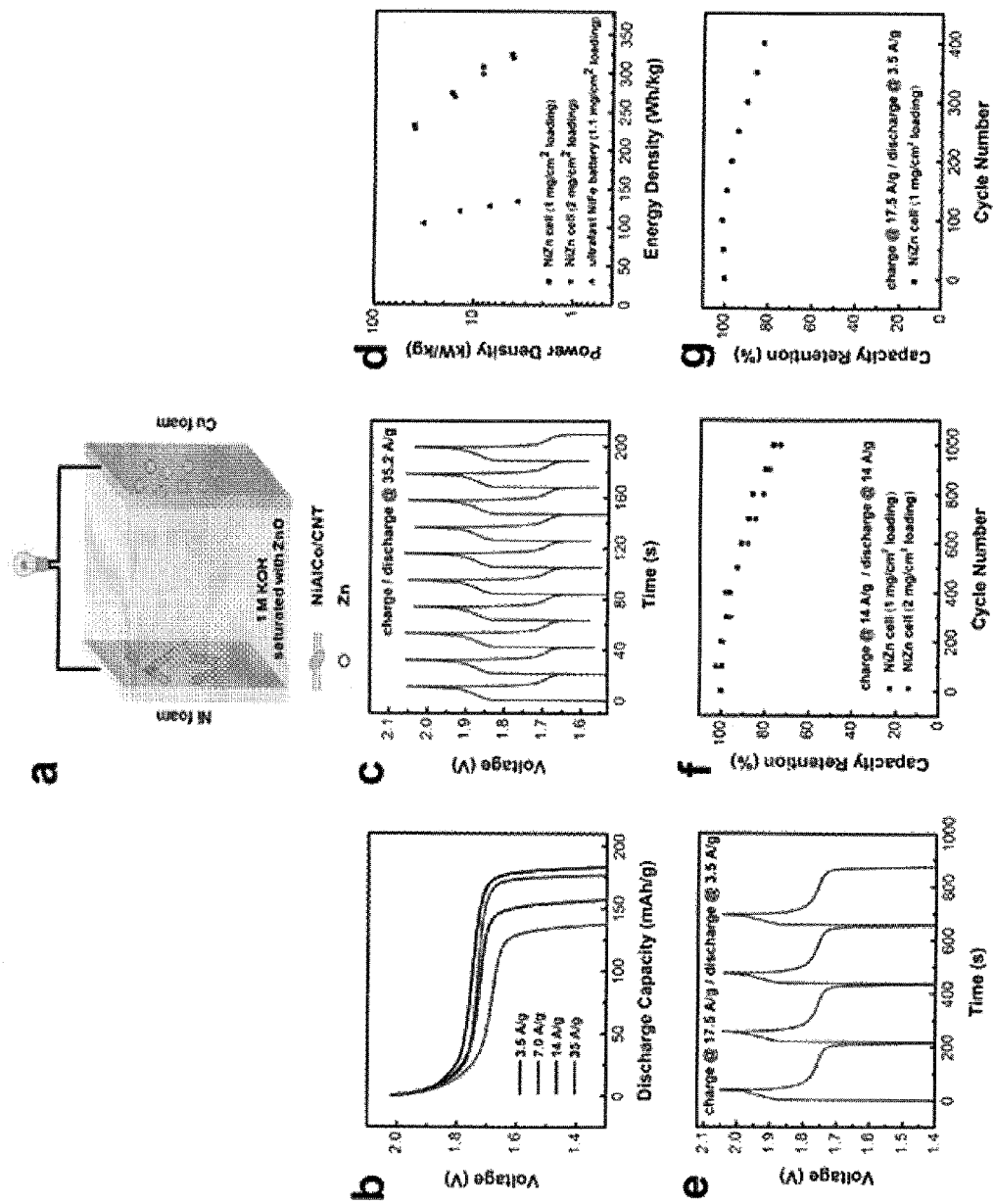
FIGS. 26a-26g show example electrochemical data of ultrafast NiZn cell made of NiAlCo/CNT hybrid on Ni foam and deposited Zn on Cu foam, consistent with various experimental aspects of the present disclosure.

FIG. 26a-26g show example electrochemical data of ultrafast NiZn cell made of NiAlCo/CNT hybrid on Ni foam and deposited Zn on Cu foam, consistent with various experimental aspects of the present disclosure. FIG. 26a shows a schematic diagram of the ultrafast NiZn cell. Galvanostatic charge/discharge measurements are carried out at different current rates under the protection of Ar (in order to prevent the oxidation of Zn). FIG. 26b shows example galvanostatic curves of NiZn cell (~1.0 mg NiAlCo/CNT and ~0.67 mg Zn) at various current density. At an operating voltage of 1.7 V-1.8 V at current density ranges from 3.5 A/g to 35 A/g. At 3.5 A/g, the NiZn battery, in certain embodiments, delivered a high capacity of 184 mAh/g. At a very high current rate of 35 A/g (corresponding to ~14 s charge/discharging time), the NiZn battery maintained a high capacity of 137.6 mAh/g, which experimentally suggests excellent capacity and rate capability. FIG. 26c shows example galvanostatic charge and discharge curves of the NiZn cell at the current density of 35.2 A/g. FIG. 26d shows an example of a Ragone plot of the energy and power density of an experimental NiZn cell (~1.0 mg NiAlCo/CNT and ~0.67 mg Zn), a NiZn cell (~2.0 mg NiAlCo/FWCNT and ~1.35 mg Zn), and an ultrafast NiFe battery (~1.1 mg Ni(OH)$_2$/MWNT and 0.7 mg FeO$_x$/graphene). The NiZn battery can deliver an energy density of 230320 Wh/kg and power density of 4-40 kW/kg. With a fast charging and discharging time of ~41 sec, the NiZn afforded a cell voltage of ~1.75 V, an energy density of 273 WW/kg and a power density of 16 kW/kg. In certain embodiments, and compared to the ultrafast NiFe alkaline battery developed, the NiZn battery has a similar power density but higher voltage and much higher energy density. In certain experimental embodiments, a NiZn battery is fabricated with doubled electrode material loading of 2 mg/cm$^2$.

FIG. 26e shows example galvanostatic charge and discharge curves of the NiZn cell at a charging current density of 17.5 A/g and a discharging current density of 3.5 A/g. Such electrodeposited zinc anode, in certain embodiments, can fail after ~100 cycles. For a stability test, the NiAlCo/CNT electrode is paired with Zn foil in 1 M KOH and 0.05 M Zn(Ac)$_2$. In such case, the main issue associated with the stability came from the degradation of α-Ni(OH)$_2$ (or NiAlCo LDH) cathode and dendrite formation of Zn anode. FIG. 26f shows that a capacity decay of ~20% was experimentally observed after 1,000 cycles under charge/discharge rate of 14 A/g. FIG. 26g shows a similar decay experimentally observed in fast charging and slow discharging cycling The stability issue can be ameliorated by pairing β-Ni(OH)$_2$/CNT with Zn foil in 6 M KOH with 0.2 M Zn(Ac)$_2$. Such NiZn cell could decay<5% over 3000 cycles under similar conditions but with smaller capacity (~70% according to comparison between α-Ni(OH)$_2$ and β-Ni(OH)$_2$).

The embodiments and specific applications discussed herein and in the above-referenced patent applications (including the Appendices therein) to which priority is claimed, may be implemented in connection with one or more of the aspects, embodiments and implementations described herein, as well as with those shown in the figures. One or more of the items depicted in the present disclosure and in the Appendices can also be implemented in a more separated or integrated manner, or removed and/or rendered as inoperable in certain cases, as is useful in accordance with particular applications. Moreover, for general information and for specifics regarding applications and implementations to which one or more embodiments of the present invention may be directed to and/or applicable, reference may be made to the references cited in the aforesaid Appendices and patent applications, all of which are fully incorporated herein by reference generally and for the reasons noted above. In view of the description herein, those skilled in the art will recognize that many changes may be made thereto without departing from the spirit and scope of the present invention.

What is claimed is:

1. An apparatus comprising:
a nanocarbon substrate including at least one of graphene and carbon nanotubes; and
inorganic particles covalently bonded to the nanocarbon substrate and therein forming a hybrid conductor, the inorganic particles including at least one of nickel and iron and being configured and arranged to facilitate transfer of charge carriers with the nanocarbon substrate via the covalent bonds between the nanocarbon substrate and the inorganic particles.

2. The apparatus of claim 1,
wherein the nanocarbon substrate includes graphene,
further including a second nanocarbon substrate including carbon nanotubes,
wherein the inorganic particles include iron oxide covalently bonded to the graphene, and
further including additional inorganic particles including nickel hydroxide covalently bonded to the carbon nanotubes.

3. The apparatus of claim 1, wherein the nanocarbon substrate includes oxidized regions of the at least one of graphene and carbon nanotubes, and wherein the inorganic particles are covalently bonded to the oxidized regions.

4. An apparatus comprising:
a first electrode including a nanocarbon structure and inorganic particles covalently bonded to the nanocarbon structure and configured and arranged to facilitate transfer of charge carriers with the nanocarbon structure via the covalent bonds between the nanocarbon structure and the inorganic particles;
a second electrode; and
a charge-passing material between the first and second electrode and configured and arranged to pass charge between the electrodes.

5. The apparatus of claim 4, wherein
the first electrode includes a carbon nanotube having nickel-based inorganic particles covalently bonded thereto, and
the second electrode includes graphene having iron-based inorganic particles covalently bonded thereto and configured and arranged to facilitate transfer of charge carriers with the first electrode via the covalent bonds between the graphene and the iron-based inorganic particles.

6. The apparatus of claim 4, wherein the first electrode includes a plurality of graphene sheets with the inorganic particles grown thereupon, the plurality of graphene sheets with nanocrystals thereupon being stacked in layers that form an electrochemical pseudo-capacitor electrode.

7. The apparatus of claim 4, wherein
the charge-passing material is a separator between the first and second electrodes and configured and arranged to facilitate ion exchange between the first and second electrodes, and
the first electrode, the second electrode and the separator form a supercapacitor.

8. The apparatus of claim 4, wherein
the charge-passing material is an electrolyte, and
the first electrode, the second electrode and the electrolyte form a battery.

9. The apparatus of claim 1, wherein the nanocarbon substrate is doped to include nitrogen and wherein the hybrid conductor includes spinel oxide nanoparticles covalently bonded to the nanocarbon substrate.

10. The apparatus of claim 9, wherein the nitrogen-doped nanocarbon structure includes $MnCo_2O_4$ bonded thereto.

11. The apparatus of claim 1, wherein the hybrid conductor includes hydrolyzed $CoAc_2$ and $MnAc_2$.

12. The apparatus of claim 1, wherein the hybrid conductor includes a hybrid $Co_2MnO_4$-graphene material.

13. The apparatus of claim 1, wherein the nanocarbon substrate includes oxidized regions of the at least one of graphene and carbon nanotubes, and wherein the inorganic particles are covalently bonded to the oxidized regions and further including the oxidized regions doped with nitrogen.

14. The apparatus of claim 1, wherein the nanocarbon substrate includes inorganic particles being covalently bonded cobalt oxide.

15. The apparatus of claim 1, further including an interface of inorganic nanocrystals and carbon, the inorganic crystals bonded with respective nanocarbon regions of the nanocarbon substrate via predominately covalent bonds.

16. The apparatus of claim 1, wherein the nanocarbon substrate includes covalently coupled inorganic crystals and carbon, and wherein the covalently coupled inorganic crystals and carbon are configured and arranged to transfer electrons from an active material interfacing with the inorganic crystals to a current collector electrically coupled to the nanocarbon substrate.

17. The apparatus of claim 1, wherein the hybrid conductor includes nanoparticles predominantly covalently bonded with said at least one of graphene and carbon nanotubes.

18. The apparatus of claim 1, wherein the nanocarbon substrate includes a region with functionalized structure based on a nanocarbon material, the functionalized structure being configured and arranged to covalently bond to a particular type of inorganic particle.

19. The apparatus of claim 1, wherein the nanocarbon substrate includes a region with functionalized structure based on a nanocarbon material, the functionalized structure being configured and arranged to covalently bond to a particular type of inorganic particle, and wherein the inorganic particles and the nanocarbon material are configured and arranged to interact and therein set a conductance characteristic of the hybrid conductor.

20. The apparatus of claim 1, wherein the nanocarbon substrate includes said at least one of graphene sheet and carbon nanotube having a content of oxygen of between about 3% and 30%.

21. The apparatus of claim 1, wherein the hybrid conductor includes a $\beta$-$Ni(OH)_2$/CNT hybrid conductive material.

22. The apparatus of claim 1, further including $Ni(OH)_2$ nanoparticles covalently bonded to the nanocarbon substrate.

23. The apparatus of claim 1, wherein the nanocarbon substrate includes a graphene sheet, certain of the nanoparticles are at respective locations on the graphene sheet, and a nanocrystal structure is on a surface of the graphene sheet.

24. The apparatus of claim 1, wherein the nanocarbon substrate includes single-crystalline nanoplates.

* * * * *